US012651567B2

(12) United States Patent　　　　(10) Patent No.:　US 12,651,567 B2
Shi et al.　　　　　　　　　　　　　(45) Date of Patent:　　　Jun. 9, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bo Shi, Beijing (CN); Weiyun Huang, Beijing (CN); Kaipeng Sun, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 222 days.

(21) Appl. No.: 17/626,149

(22) PCT Filed: Apr. 15, 2021

(86) PCT No.: PCT/CN2021/087545
　　§ 371 (c)(1),
　　(2) Date: Jan. 11, 2022

(87) PCT Pub. No.: WO2021/238490
　　PCT Pub. Date: Dec. 2, 2021

(65) Prior Publication Data
　　US 2022/0352285 A1　　Nov. 3, 2022

(30) Foreign Application Priority Data
　　May 29, 2020　(CN) .......................... 202010479765.3

(51) Int. Cl.
　　*G09G 3/3233*　　(2016.01)
　　*G09G 3/3266*　　(2016.01)
　　　　　　(Continued)

(52) U.S. Cl.
　　CPC ........... *G09G 3/3233* (2013.01); *H10K 59/12* (2023.02); *H10K 59/126* (2023.02);
　　　　　　(Continued)

(58) Field of Classification Search
　　CPC ............. H10K 59/126; H10K 59/1213; H10K 59/351; H10K 50/87; H10K 50/86;
　　　　　　(Continued)

(56) References Cited

U.S. PATENT DOCUMENTS 10,733,931 B2 *　8/2020　Jung ..................... H10K 59/121
10,756,136 B1 *　8/2020　Ma ........................ H10H 29/142
　　　　　　(Continued)

FOREIGN PATENT DOCUMENTS

CN　　110289299 A　*　9/2019　......... H01L 27/3244
CN　　110504289 A　*　11/2019　........... G09G 3/3225
　　　　　　(Continued)

OTHER PUBLICATIONS

First Office Action of the related U.S. Appl. No. 17/857,257 (which is continuation of this application), dated Mar. 7, 2024.
　　　　　　(Continued)

*Primary Examiner* — Chad M Dicke
*Assistant Examiner* — Mario Andres Autore, Jr.
(74) *Attorney, Agent, or Firm* — Chiwin Law LLC

(57)　　　　　ABSTRACT

A display substrate and a display device are provided. The display substrate has a first side for display and a second side, the display substrate includes a first display region and a second display region, the first display region allows light from the first side to be at least partially transmitted to the second side; the first display region includes a plurality of first sub-pixels, each of the first sub-pixels includes a first light-emitting device, the second display region includes a plurality of first pixel circuits, and the first pixel circuits are respectively electrically connected to a plurality of first
　　　　　　(Continued)

light-emitting devices; the display region further includes a first light-shielding layer, in a direction perpendicular to a surface of the display substrate, the first light-shielding layer is at least partially overlapped with the second display region, and the first light-shielding layer is not overlapped with the first display region.

18 Claims, 14 Drawing Sheets

(51) Int. Cl.

| | |
|---|---|
| *H10D 86/40* | (2025.01) |
| *H10D 86/60* | (2025.01) |
| *H10K 59/12* | (2023.01) |
| *H10K 59/121* | (2023.01) |
| *H10K 59/126* | (2023.01) |
| *H10K 59/131* | (2023.01) |
| *H10K 59/35* | (2023.01) |
| *H10K 59/65* | (2023.01) |
| *H10K 59/80* | (2023.01) |

(52) U.S. Cl.
CPC ....... *H10K 59/131* (2023.02); *H10K 59/8794* (2023.02); *G09G 3/3266* (2013.01); *G09G 2300/0408* (2013.01); *G09G 2300/0804* (2013.01); *G09G 2300/0819* (2013.01); *G09G 2300/0842* (2013.01); *G09G 2360/14* (2013.01); *H10D 86/441* (2025.01); *H10D 86/60* (2025.01); *H10K 59/1213* (2023.02); *H10K 59/351* (2023.02); *H10K 59/65* (2023.02); *H10K 59/8791* (2023.02)

(58) Field of Classification Search
CPC .... H10K 59/131; H10K 59/179; H10K 59/13; H10K 59/65; H10K 59/12–121; G09G 2300/0842; G09G 3/3233; H01L 29/78633
See application file for complete search history.

(56) References Cited

U.S. PATENT DOCUMENTS

| | | | | |
|---|---|---|---|---|
| 11,189,672 | B2 | 11/2021 | Wang et al. | |
| 12,143,522 | B2 * | 11/2024 | Shin | .................... H04M 1/0266 |
| RE50,291 | E | 2/2025 | Hsieh | |
| 2006/0113905 | A1 * | 6/2006 | Nakamura | ............. H10K 59/12 |
| | | | | 313/511 |
| 2016/0282684 | A1 | 9/2016 | Nakamura | |
| 2017/0104090 | A1 | 4/2017 | Koezuka et al. | |
| 2017/0142837 | A1 * | 5/2017 | Kim | ....................... H10K 59/87 |
| 2018/0040682 | A1 | 2/2018 | Ebisuno et al. | |
| 2018/0130416 | A1 * | 5/2018 | Murakami | ........... G09G 3/3233 |
| 2019/0131371 | A1 | 5/2019 | Yi et al. | |
| 2019/0165065 | A1 | 5/2019 | Kong et al. | |
| 2019/0172885 | A1 | 6/2019 | Lee et al. | |
| 2019/0339570 | A1 | 11/2019 | Chen et al. | |
| 2020/0064968 | A1 * | 2/2020 | Kim | ...................... G06F 3/0443 |
| 2020/0066809 | A1 * | 2/2020 | Liu | ...................... H10K 59/121 |
| 2020/0211473 | A1 | 7/2020 | Kim et al. | |
| 2020/0357871 | A1 * | 11/2020 | Chung | ................... H04N 23/57 |
| 2021/0066409 | A1 * | 3/2021 | Fan | ....................... G06F 1/1605 |
| 2021/0134892 | A1 | 5/2021 | Hwang et al. | |
| 2021/0159286 | A1 * | 5/2021 | Ma | ........................ H10K 59/353 |
| 2021/0200263 | A1 * | 7/2021 | Hu | ....................... H10F 39/8023 |
| 2021/0202621 | A1 * | 7/2021 | Liang | ................... H10K 59/124 |
| 2021/0296404 | A1 * | 9/2021 | You | ................... H10K 59/8792 |
| 2022/0005920 | A1 | 1/2022 | Zha | |
| 2022/0077244 | A1 * | 3/2022 | Wang | ................... G09G 3/3233 |
| 2022/0199710 | A1 | 6/2022 | Xu et al. | |

FOREIGN PATENT DOCUMENTS

| | | | | | |
|---|---|---|---|---|---|
| CN | 110520919 | A | | 11/2019 | |
| CN | 110660835 | A | | 1/2020 | |
| CN | 110767729 | A | | 2/2020 | |
| CN | 111129100 | A | * | 5/2020 | .......... G06F 1/1605 |
| CN | 111129102 | A | * | 5/2020 | ......... H01L 27/3234 |
| CN | 111180494 | A | | 5/2020 | |

OTHER PUBLICATIONS

Third Non-final Office Action of Continuation U.S. Appl. No. 17/857,257, dated Jul. 29, 2025.

Final Office Action issued in the co-pending U.S. Appl. No. 17/857,257, dated Mar. 20, 2025.

Third Final Office Action of Continuation U.S. Appl. No. 17/857,257, dated Feb. 13, 2026.

* cited by examiner

P2/EM2/D2
20
P1/EM1
10
D1
30
P3/EM3/D3

P2/D2  D1  20
P1
10

DISPLAY SUBSTRATE AND DISPLAY DEVICE

CROSS-REFERENCE TO RELATED APPLICATION

This application is a U.S. National Phase Entry of International Application No. PCT/CN2021/087545 filed on Apr. 15, 2021, designating the United States of America and claiming priority to Chinese Patent Application No. 202010479765.3, filed on May 29, 2020. The present application claims priority to and the benefit of the above-identified applications and the above-identified applications are incorporated by reference herein in their entirety.

TECHNICAL FIELD

Embodiments of the present disclosure relate to a display substrate and a display device.

BACKGROUND

With the development of display electronic products such as mobile phones, the increase of the screen-to-body ratio of a display screen has become a product trend, and functional components, such as front cameras, necessary for the mobile phones have become a major factor restricting the increase of the screen-to-body ratio. To solve this problem, the industry has proposed a solution, called "under-screen camera", in which a camera and a display panel are combined into a display device. In such a solution, the display device includes a display panel and a camera located below the display panel. A region, where the under-screen camera is located, of the display device can emit light and display like other regions, and has a camera function at the same time.

SUMMARY

At least one embodiment of the present disclosure provides a display substrate, the display substrate has a first side for display and a second side opposite to the first side, the display substrate comprises a display region; the display region comprises a first display region and a second display region at least partially surrounding the first display region, the first display region allows light from the first side to be at least partially transmitted to the second side; the first display region comprises a plurality of first sub-pixels arranged in an array, each of the plurality of first sub-pixels comprises a first light-emitting device, the second display region comprises a plurality of first pixel circuits, and the plurality of first pixel circuits are respectively electrically connected to a plurality of first light-emitting devices of the plurality of first sub-pixels to drive the plurality of first light-emitting devices, respectively; the display region further comprises a first light-shielding layer, in a direction perpendicular to a surface of the display substrate, the first light-shielding layer is at least partially overlapped with the second display region, and the first light-shielding layer is not overlapped with the first display region.

For example, the display substrate provided by at least one embodiment of the present disclosure further comprises a power line and a reset voltage line, the first light-shielding layer is electrically connected to the power line or the reset voltage line.

For example, in the display substrate provided by at least one embodiment of the present disclosure, each of the plurality of first pixel circuits comprises a first thin film transistor, the first thin film transistor comprises a first active layer, a first gate electrode, and a first source-drain electrode; the first light-shielding layer and the first source-drain electrode are arranged in a same layer.

For example, the display substrate provided by at least one embodiment of the present disclosure, the second display region comprises a first sub-region at least partially surrounding the first display region and a second sub-region at least partially surrounding the first sub-region, the first light-shielding layer is in the first sub-region, and the plurality of first pixel circuits are in the second sub-region.

For example, the display substrate provided by at least one embodiment of the present disclosure further comprises a plurality of signal lines respectively electrically connected to the plurality of first pixel circuits, the plurality of signal lines extend through the first sub-region, each of the plurality of first pixel circuits further comprises a first storage capacitor, and the first storage capacitor comprises a first capacitor electrode and a second capacitor electrode, the first capacitor electrode and the first gate electrode are arranged in a same layer, and the plurality of signal lines are arranged in a same layer as the first capacitor electrode or the second capacitor electrode.

For example, the display substrate provided by at least one embodiment of the present disclosure further comprises a base substrate and a second light-shielding layer, the plurality of first sub-pixels are on the base substrate, and the second light-shielding layer is between the plurality of first pixel circuits and the base substrate to shield at least part of circuit structures of the plurality of first pixel circuits; the first light-shielding layer and the second light-shielding layer are arranged in a same layer.

For example, in the display substrate provided by at least one embodiment of the present disclosure, the first light-shielding layer and the second light-shielding layer are continuously arranged to form an integrated layer, and the integrated layer has an opening in the first display region, so that in the direction perpendicular to the surface of the display substrate, the first light-shielding layer is not overlapped with the first display region.

For example, the display substrate provided by at least one embodiment of the present disclosure further comprises a base substrate and a heat dissipation layer, wherein the plurality of first sub-pixels are on a first side of the base substrate, and the heat dissipation layer is on a second side of the base substrate, the first side and the second side are opposite; the first light-shielding layer and the heat dissipation layer are arranged in a same layer.

For example, in the display substrate provided by at least one embodiment of the present disclosure, the first light-shielding layer and the heat dissipation layer are continuously arranged to form an integrated layer, and the integrated layer has an opening in the first display region, so that in the direction perpendicular to the surface of the display substrate, the first light-shielding layer is not overlapped with the first display region.

For example, in the display substrate provided by at least one embodiment of the present disclosure, the second display region further comprises a plurality of second sub-pixels, and each of the plurality of second sub-pixels comprises a second light-emitting device and a second pixel circuit electrically connected to the second light-emitting device, and the second pixel circuit is configured to drive the second light-emitting device, in the second display region, the plurality of second pixel circuits are arranged in a first array, the plurality of first pixel circuits are arranged in gaps of the first array, and the plurality of first pixel circuits and the plurality of second pixel circuits are arranged in a second array as a whole.

For example, in the display substrate provided by at least one embodiment of the present disclosure, each of the plurality of first pixel circuits comprises a first thin film transistor, the first thin film transistor comprises a first active layer, a first gate electrode, and a first source-drain electrode, the first light-emitting device comprises a first electrode, a second electrode, and a first light-emitting layer between the first electrode and the second electrode of the first light-emitting device, the first electrode of the first light-emitting device is electrically connected to the first source-drain electrode through a first via; each of the plurality of second pixel circuits comprises a second thin film transistor, and the second thin film transistor comprises a second active layer, a second gate electrode, and a second source-drain electrode, the second light-emitting device comprises a first electrode, a second electrode, and a second light-emitting layer between the first electrode and the second electrode of the second light-emitting device, the first electrode of the second light-emitting device is electrically connected to the second source-drain electrode through a second via; in a plane where the display substrate is located, a shortest distance between the first via and a light-emitting region of the first light-emitting layer is smaller than a shortest distance between the second via and a light-emitting region of the second light-emitting layer.

For example, in the display substrate provided by at least one embodiment of the present disclosure, an orthographic projection of the first via on the plane where the display substrate is located is at least partially overlapped with an orthographic projection of the light-emitting region of the first light-emitting layer on the plane where the display substrate is located.

For example, in the display substrate provided by at least one embodiment of the present disclosure, the display region comprises a third display region at least partially surrounding the second display region, and the third display region comprises a plurality of third sub-pixels arranged in an array, an arrangement density of the plurality of third sub-pixels in the third display region is greater than an arrangement density of the plurality of first sub-pixels in the first display region, and is also greater than an arrangement density of the plurality of second sub-pixels in the second display region.

For example, in the display substrate provided by at least one embodiment of the present disclosure, the arrangement density of the plurality of first sub-pixels in the first display region is equal to the arrangement density of the plurality of second sub-pixels in the second display region.

For example, the display substrate provided by at least one embodiment of the present disclosure further comprises a first scan driving circuit and a second scan driving circuit respectively located on two opposite sides of the display region, the first scan driving circuit and the second scan driving circuit are configured to provide electrical signals for the plurality of third sub-pixels in the third display region; the first scan driving circuit is further configured to provide electrical signals for a plurality of second sub-pixels and a plurality of first pixel circuits in the second display region on a side of the first display region close to the first scan driving circuit, and the second scan driving circuit is further configured to provide electrical signals for a plurality of second sub-pixels and a plurality of first pixel circuits in the second display region on a side of the first display region close to the second scan driving circuit.

At least one embodiment of the present disclosure provides a display device, the display device comprises any one of the above display substrates and a sensor, the sensor is on the second side of the display substrate, and the sensor is configured to receive light from the first side.

For example, in the display device provided by at least one embodiment of the present disclosure, in the direction perpendicular to the surface of the display substrate, the sensor is at least partially overlapped with the first display region of the display substrate.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In an "under-screen camera" design scheme, in order to allow more light to enter the camera located below the display panel, the display panel can be designed to have a high pixel density region and a low pixel density region, and the camera is placed under the low pixel density region that allows more light to pass through.

Figure 1A:
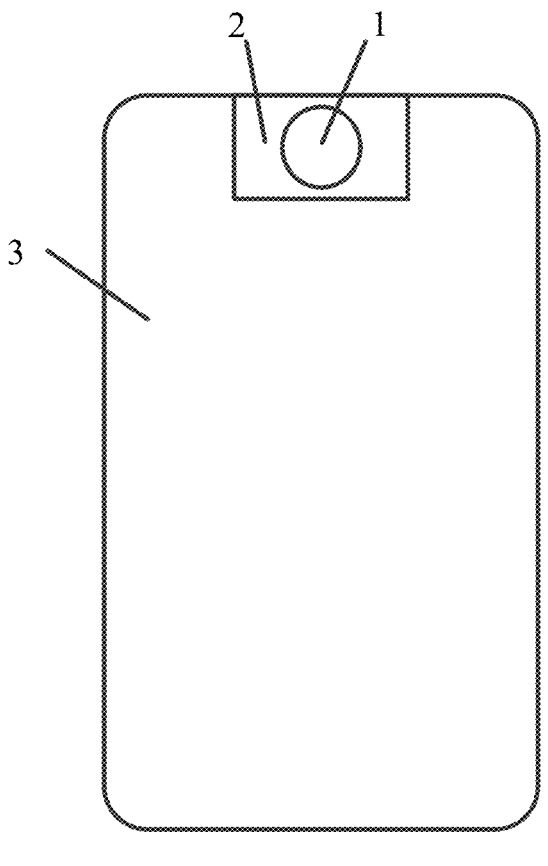
FIG. 1A is a schematic plan view of a display substrate.
Figure 1B:
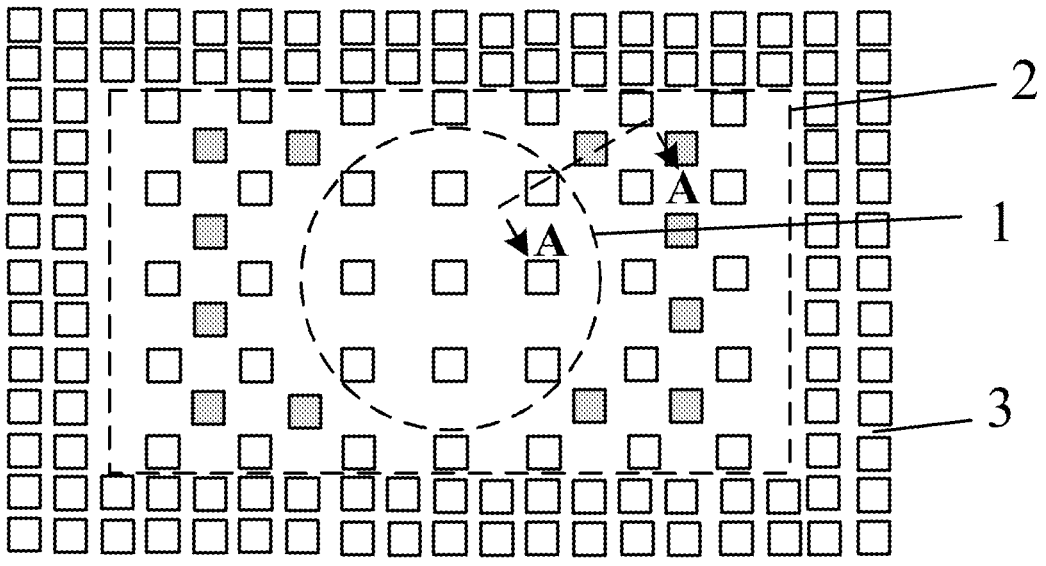
FIG. 1B is a partial enlarged schematic diagram of a display substrate.
Figure 2:
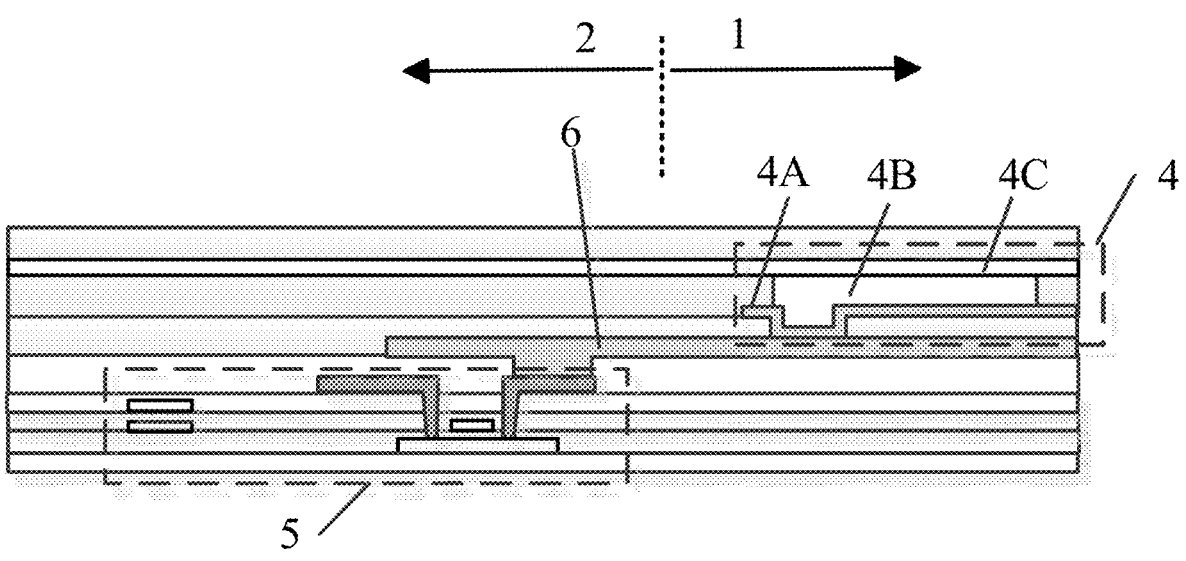
FIG. 2 is a schematic cross-sectional view of the display substrate in FIG. 1B along a line A-A.

For example, FIG. 1A shows a schematic plan view of a display substrate, FIG. 1B is a partial enlarged schematic diagram of the display substrate shown in FIG. 1A, and FIG. 2 shows a schematic cross-sectional view of the display substrate in FIG. 1B along a line A-A.

As shown in FIG. 1A, FIG. 1B, and FIG. 2, a display region of the display substrate includes a light-transmitting display region 1, a peripheral display region 2, and a main display region 3, which are arranged side by side.

For example, the main display region 3 is a main display region and has a higher resolution (PPI, Pixel Per Inch), that is, sub-pixels for display with a higher arrangement density are arranged in the main display region 3. Each sub-pixel includes a light-emitting device and a pixel circuit that drives the light-emitting device. The light-transmitting display region 1 can allow light incident from a display side of the display substrate to pass through the display substrate to reach a back side of the display substrate, so that the light is used for normal operation of components such as a sensor (such as an image sensor) disposed on the back side of the display substrate.

The light-transmitting display region 1 and the peripheral display region 2 also include a plurality of sub-pixels for display. However, because the pixel circuit of the sub-pixel includes metal lines, metal electrodes, active layers, etc., generally, at least part of the pixel circuit is opaque, or the light transparency of at least part of the pixel circuit cannot meet the requirements of the light-transmitting display region 1. In order to ensure the light transparency of the light-transmitting display region 1, the pixel circuits of the sub-pixels (for example, sub-pixels shown in the frame in the light-transmitting display region 1 in FIG. 1B) in the light-transmitting display region 1 can be arranged in the peripheral display region 2, as shown by the gray frame in the peripheral display region 2, thereby occupying part of the space of the peripheral display region 2. The remaining space of the peripheral display region 2 is used to dispose the sub-pixels of the peripheral display region 2 itself, for example, each white frame in the peripheral display region 2 represents a sub-pixel. In this case, for example, the sub-pixels of the peripheral display region 2 (white frames in FIG. 1B) and the pixel circuits of the sub-pixels in the light-transmitting display region 1 (gray frames in FIG. 1B) are arranged in an array in the peripheral display region 2 as a whole. Therefore, the resolution of the light-transmitting display region 1 and the resolution of the peripheral display region 2 are lower than the resolution of the main display region 3. That is, the density of the sub-pixels, for display, arranged in the light-transmitting display region 1 and the density of the sub-pixels, for display, arranged in the peripheral display region 2 are smaller than the density of the sub-pixels in the main display region 3.

As shown in FIG. 2, a light-emitting device 4 of one sub-pixel in the light-transmitting display region 1 includes an anode 4A, a cathode 4C, and a light-emitting layer 4B between the anode 4A and the cathode 4C, the anode 4A is connected to a pixel circuit 5 in the peripheral display region 2 through a line 6, so that the light-emitting device 4 is controlled and driven by the pixel circuit 5. The pixel circuit 5 includes structures such as one or more thin film transistors, a capacitor, and the like. In the plane of the display substrate, there is a certain gap between the layers of these structures, that is, many narrow gaps are formed. The light on the display side of the display substrate may be obliquely incident on the peripheral display region 2 through the light-transmitting display region 1, and pass through the gaps in the peripheral display region 2 and enters the sensor (for example, an image sensor) on the back side of the display substrate, which is equivalent to a case that the light passes through a grating with a very low aperture ratio, and therefore a strong diffraction phenomenon will occur, which may aggravate the glare phenomenon of the sensor during imaging, and reduce the resolution, thereby affecting the normal function of the sensor.

At least one embodiment of the present disclosure provides a display substrate and a display device. The display substrate has a first side for display and a second side opposite to the first side. The display substrate comprises a display region, the display region comprises a first display region and a second display region at least partially surrounding the first display region, the first display region allows light from the first side to be at least partially transmitted to the second side; the first display region comprises a plurality of first sub-pixels arranged in an array, each first sub-pixel comprises a first light-emitting device, the second display region comprises a plurality of first pixel circuits, and the plurality of first pixel circuits are respectively electrically connected to a plurality of first light-emitting devices of the plurality of the first sub-pixels to drive the plurality of first light-emitting devices, respectively; the display region further comprises a first light-shielding layer, in a direction perpendicular to a surface of the display substrate, the first light-shielding layer is at least partially overlapped with the second display region, and the first light-shielding layer is not overlapped with the first display region. Therefore, in the embodiment, the first light-shielding layer can block the light from entering the second display region, so as to prevent the light from entering the sensor provided on the second side of the display substrate through the second display region, thereby improving the sensing effect of the sensor.

Hereinafter, the display substrate and the display device of the present disclosure will be exemplarily described through several specific embodiments.

Figure 3:
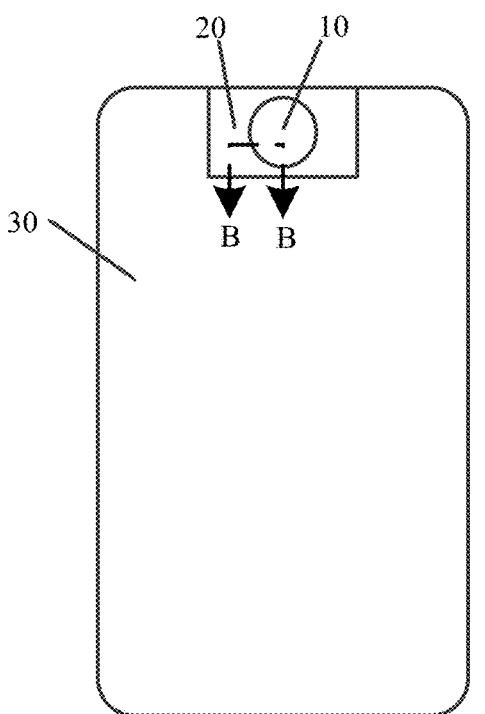
FIG. 3 is a schematic plan view of a display substrate provided by at least one embodiment of the present disclosure.

At least one embodiment of the present disclosure provides a display substrate, and FIG. 3 shows a schematic plan view of the display substrate. As shown in FIG. 3, the display substrate has a first side for display (i.e., a display side) and a second side (i.e., a non-display side, which may also be referred to as a back side) opposite to the first side. The display substrate comprises a display region, the display region comprises a first display region 10 and a second display region 20 at least partially surrounding the first display region 10. The first display region 10 allows light from the first side to be at least partially transmitted to the second side, that is, the first display region 10 is a transparent display region, the light can pass through the transparent display region from the display side of the display substrate to the non-display side. For example, a sensor such as a camera, an infrared sensing device, or the like may be provided on the non-display side, and the sensor can collect and use the light transmitted from the first display region 10 to the non-display side for sensing, such as imaging.

Figure 4A:
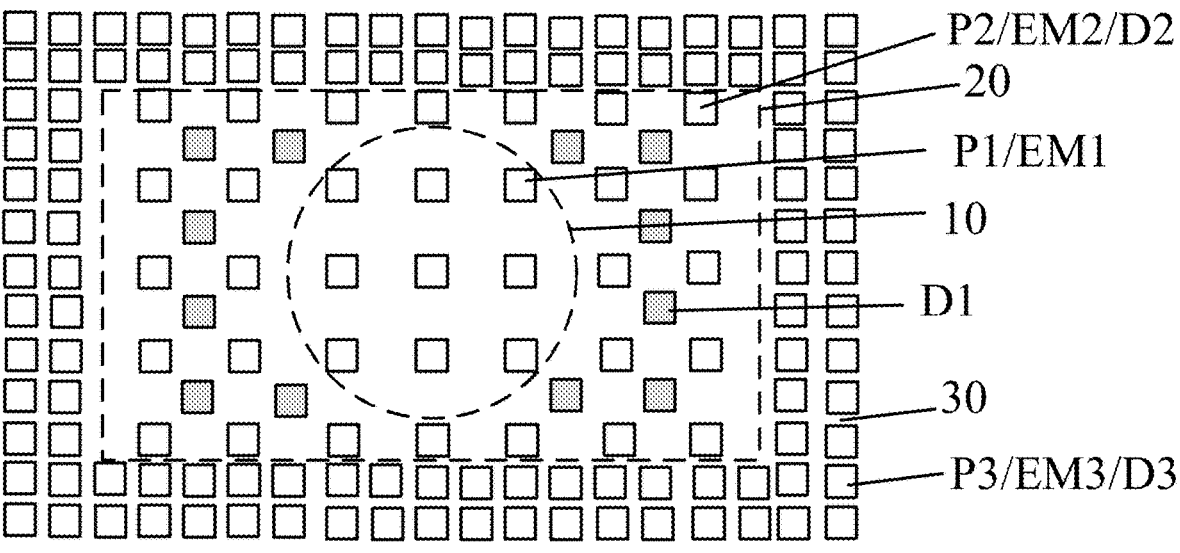
FIG. 4A is a partial enlarged schematic diagram of a display substrate provided by at least one embodiment of the present disclosure.

For example, FIG. 4A shows a schematic diagram of an arrangement of sub-pixels in the display region. As shown in FIG. 4A, the first display region 10 comprises a plurality of first sub-pixels P1 arranged in an array, each first sub-pixel P1 comprises a first light-emitting device EM1, and a plurality of first light-emitting devices EM1 are arranged in an array; the second display region 20 comprises a plurality of first pixel circuits D1, and the plurality of first pixel circuits D1 are respectively electrically connected to the plurality of first light-emitting devices EM1 of the plurality of first sub-pixels P1 to drive the plurality of first light-emitting devices EM1, respectively. That is, the pixel circuits of the plurality of first sub-pixels P1 in the first display region 10 are arranged in the second display region 20, thereby avoiding too many structures or opaque structures arranged in the first display region 10, thereby ensuring the light transparency of the first display region 10, which is beneficial to transmit more light for being sensed by the sensor, and improves the sensing quality. For example, the second display region 20 further comprises a plurality of second sub-pixels P2, and each second sub-pixel P2 comprises a second light-emitting device EM2 and a second pixel circuit D2 electrically connected to the second light-emitting device EM2, the second pixel circuit D2 is configured to drive the second light-emitting device EM2. In the second display region 20, the plurality of second pixel circuits D2 are arranged in a first array, and the plurality of first pixel circuits D1 are arranged in gaps of the first array, and the plurality of first pixel circuits D1 and the plurality of second pixel circuits D2 are arranged in a second array as a whole, that is, the first array is a sub-array of the second array. For example, the plurality of first light-emitting devices EM1 and the plurality of second sub-pixels P2 (i.e., the plurality of second light-emitting devices EM2) are arranged uniformly in the first display region 10 and the second display region 20, respectively, so that the first display region 10 and the second display region 20 as a whole can uniformly emit light and display.

Figure 4B:
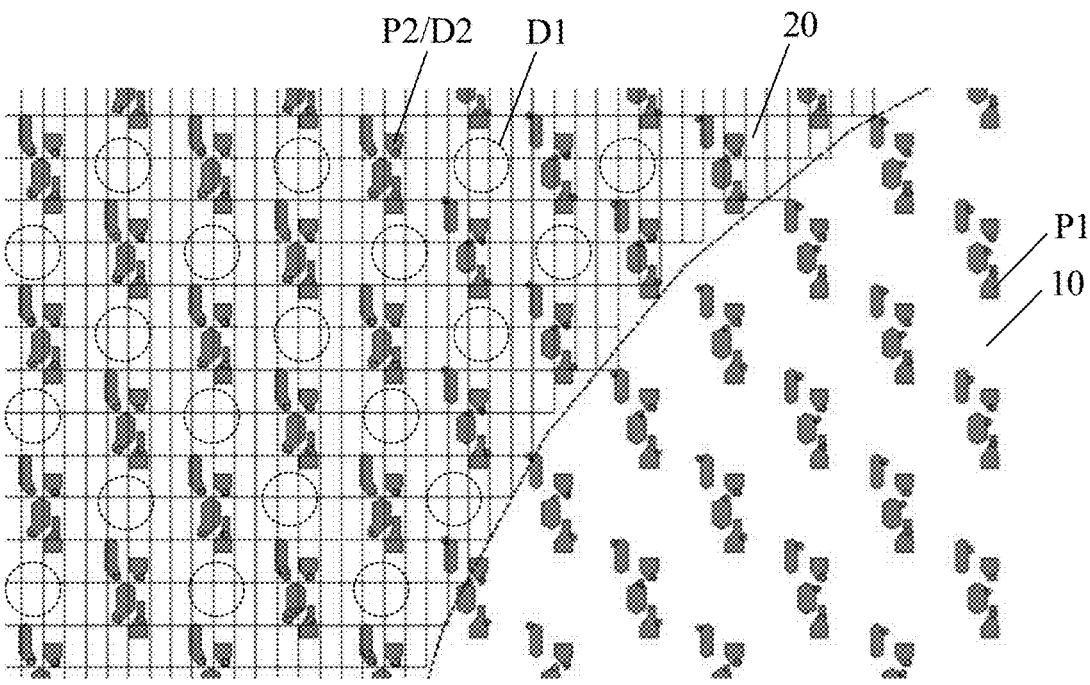
FIG. 4B is a schematic diagram of an arrangement of sub-pixels in a first display region and a second display region in a display substrate provided by at least one embodiment of the present disclosure.

For example, FIG. 4B shows a schematic diagram of a specific arrangement of sub-pixels in the first display region and the second display region. As shown in FIG. 4B, the left side of the arc-shaped dashed line is the second display region 20, and the right side of the arc-shaped dashed line is the first display region 10. In the second display region 20, the second pixel circuits D2 of the plurality of second sub-pixels P2 are arranged in a first array, and the plurality of first pixel circuits D1 are arranged in the gaps of the first array, for example, in the parts framed by the dashed circles, so that the plurality of first pixel circuits D1 and the plurality of second pixel circuits D2 as a whole are arranged in the second array, and therefore the plurality of first light-emitting devices EM1 of the plurality of sub-pixels P1 and the plurality of second sub-pixels P2 (i.e., the plurality of second light-emitting devices EM2) are arranged uniformly in the first display region 10 and the second display region 20, respectively.

For example, the display region further includes a first light-shielding layer. In a direction perpendicular to the surface of the display substrate, the first light-shielding layer and the second display region 20 are at least partially overlapped with each other, and the first light-shielding layer is not overlapped with the first display region 10. Therefore, the first light-shielding layer can shield the light from entering the second display region 20 and passing through the gaps between various lines, electrodes, or active layers in the second display region 20, so as to prevent the light from passing through the second display region 20 to reach the second side of the display substrate, thereby improving the sensing quality of the sensor, for example, improving the shooting quality of the under-screen camera.

Figure 5:
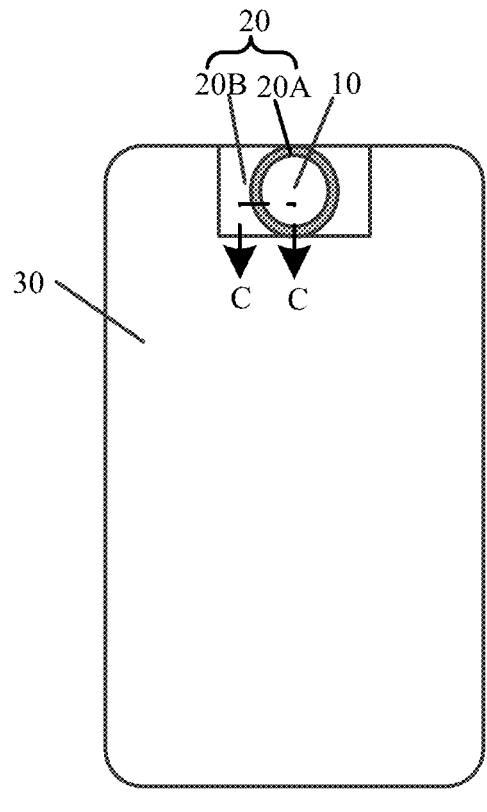
FIG. 5 is a schematic plan view of a display substrate provided by at least one embodiment of the present disclosure.
Figure 6:
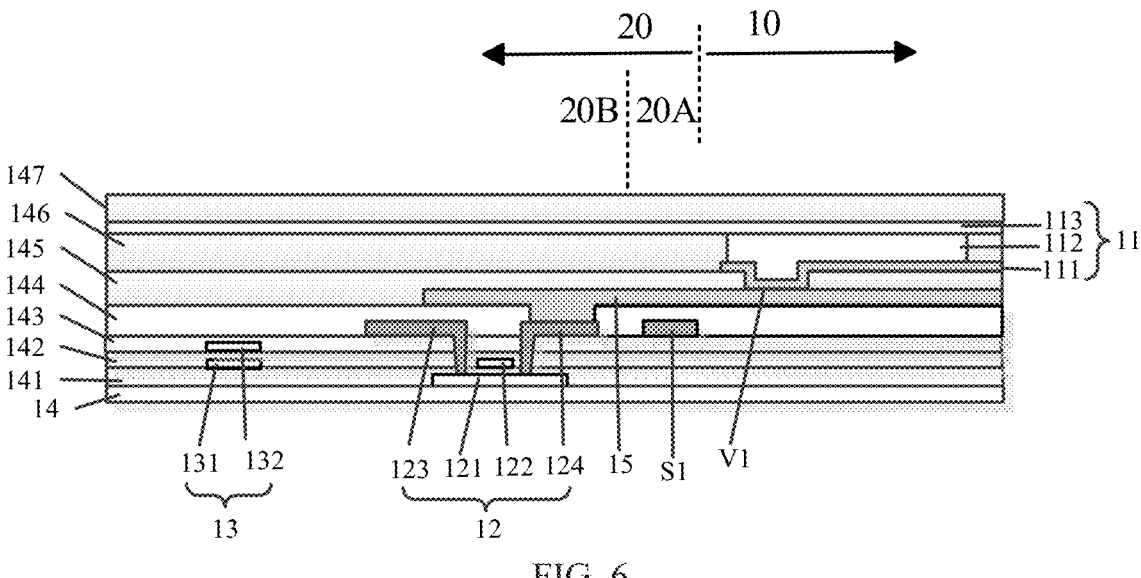
FIG. 6 is a schematic cross-sectional view of the display substrate in FIG. 5 along a line C-C.

For example, FIG. 5 shows a schematic plan view of a display substrate provided by at least one embodiment of the present disclosure, and FIG. 6 shows a schematic cross-sectional view of the display substrate along a line C-C. As shown in FIGS. 5 and 6, each of the plurality of first pixel circuits comprises a first thin film transistor 12, the first thin film transistor 12 comprises a first active layer 121, a first gate electrode 122, and first source-drain electrodes 123 and 124; for example, the first light-shielding layer 51 may be in the same layer as the first source-drain electrodes 123 and 124, thereby simplifying the manufacturing process of the display substrate.

It should be noted that in the embodiments of the present disclosure, "in the same layer" means that two functional layers or structural layers are formed in the same layer in the hierarchical structure of the display substrate and with the same material. For example, in the manufacturing process, the two functional layers or structural layers may be formed of the same material layer, and the required patterns and structures can be formed by the same patterning process.

For example, in some embodiments, as shown in FIG. 5 and FIG. 6, the second display region 20 comprises a first sub-region 20A at least partially surrounding the first display region 10 and a second sub-region 20B at least partially surrounding the first sub-region 20A, that is, the second sub-region 20B is farther from the first display region 10 than the first sub-region 20A. The first light-shielding layer S1 is disposed in the first sub-region 20A, and the plurality of first pixel circuits are disposed in the second sub-region 20B. For example, the first light-shielding layer S1 at least partially covers the first sub-region 20A. For example, in some examples, the first light-shielding layer S1 completely covers the first sub-region 20A, thereby completely shielding light from entering the second sub-region 20B.

Figure 7:
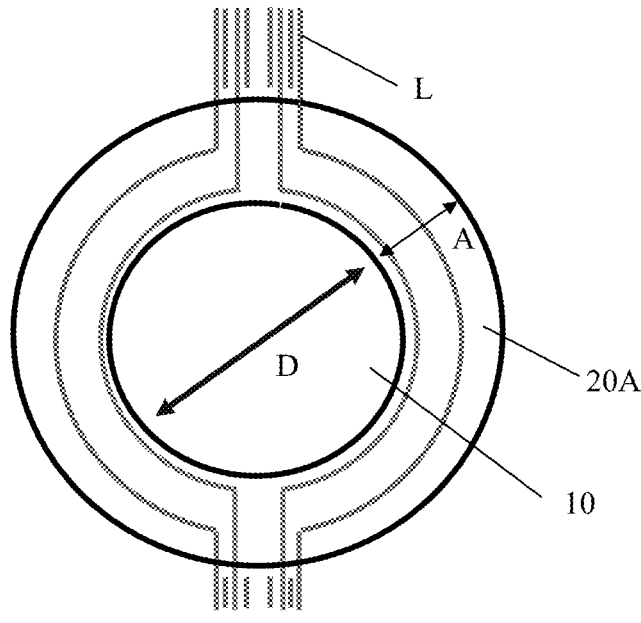
FIG. 7 is a schematic plan view of a first display region and a part of a second display region in a display substrate provided by at least one embodiment of the present disclosure.

For example, as shown in FIG. 7, the display substrate further comprises a plurality of signal lines L, the plurality of signal lines L extend in the display region along the vertical direction in the figure, in order to avoid crossing the first display region 10 in the extension direction of the plurality of signal lines L, the plurality of signal lines L are bent to extend through the first sub-region 20A, so as to bypass the first display region 10, in the first sub-region 20A, for example, the plurality of signal lines L extend parallel to each other, and there are slits between the plurality of signal lines. For another example, the plurality of signal lines L may also extend in the display region along the horizontal direction in the figure, in order to avoid crossing the first display region 10 in the extension direction of the plurality of signal lines L, the plurality of signal lines L are bent to extend through the first sub-region 20A, so as to bypass the first display region 10, in the first sub-region 20A, for example, the plurality of signal lines L extend parallel to each other, and there are slits between the plurality of signal lines. As shown in FIG. 6, the first pixel circuit further comprises a first storage capacitor 13. The first storage capacitor 13 comprises a first capacitor electrode 131 and a second capacitor electrode 132, the first capacitor electrode 131 and the first gate electrode 122 are arranged in the same layer, and the plurality of signal lines L are arranged in the same layer as the first capacitor electrode 131 or the second capacitor electrode 132. For example, the plurality of signal lines L may be data lines, scan lines (for example, gate lines, reset lines, light-emitting control lines, etc.), power voltage lines, and the like.

Figure 8:
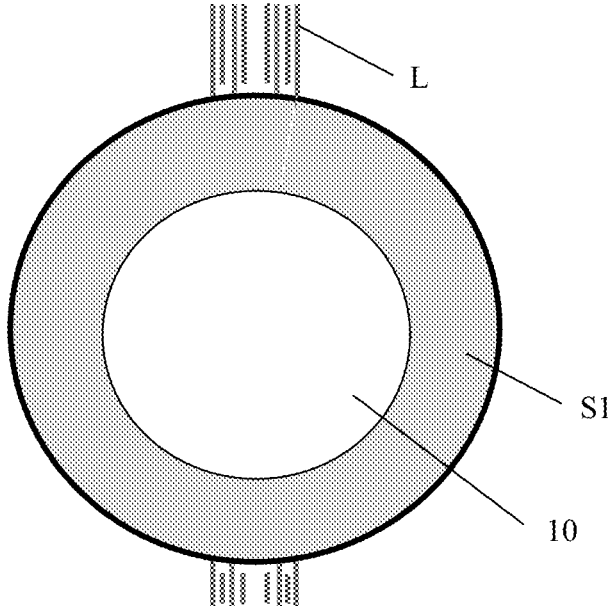
FIG. 8 is another schematic plan view of a first display region and a part of a second display region in a display substrate provided by at least one embodiment of the present disclosure.

For example, in some embodiments, as shown in FIG. 8, an orthographic projection of the first light-shielding layer S1 on a plane where the display substrate is located completely covers orthographic projections of the plurality of signal lines L in the first sub-region 20A on the plane where the display substrate is located, or completely covers an orthographic projection of the first sub-region 20A itself on the plane where the display substrate is located, so that in the direction perpendicular to the surface of the display substrate, the first light-shielding layer S1 is overlapped with the plurality of signal lines L, thereby shielding one or more slits between the signal lines L.

For example, in some examples, a shape of the first display region 10 may be a suitable shape such as a circle, a rectangle, a racetrack shape, etc., and a circle is shown as an example in the figure. For example, a size D of the first display region 10 may be 3 mm-4 mm, such as 3.2 mm, 3.4 mm, 3.6 mm, etc., so as to transmit enough light, for example, for imaging. For example, the size of the first display region 10 may be a diameter of a circle, a diagonal of a square or a rectangle, or the like. For example, a width A of the first sub-region 20A, that is, an arrangement width of the first light-shielding layer S1, may be 0.1 mm-0.3 mm, such as 0.1 mm or 0.2 mm, etc., so as to achieve a certain light-shielding effect without affecting the normal display of the display region.

For example, in some embodiments, the display substrate further comprises a power line and a reset voltage line (described in detail later), and the first light-shielding layer S1 is electrically connected to the power line or the reset voltage line. Therefore, a certain direct current signal can be input to the first light-shielding layer S1 to prevent the first light-shielding layer S1 from being in a floating state, thereby avoiding the influence on the signal transmission on the display substrate.

For example, in other embodiments, the first light-shielding layer S1 may also be disposed on other positions of the display substrate.

Figure 9:
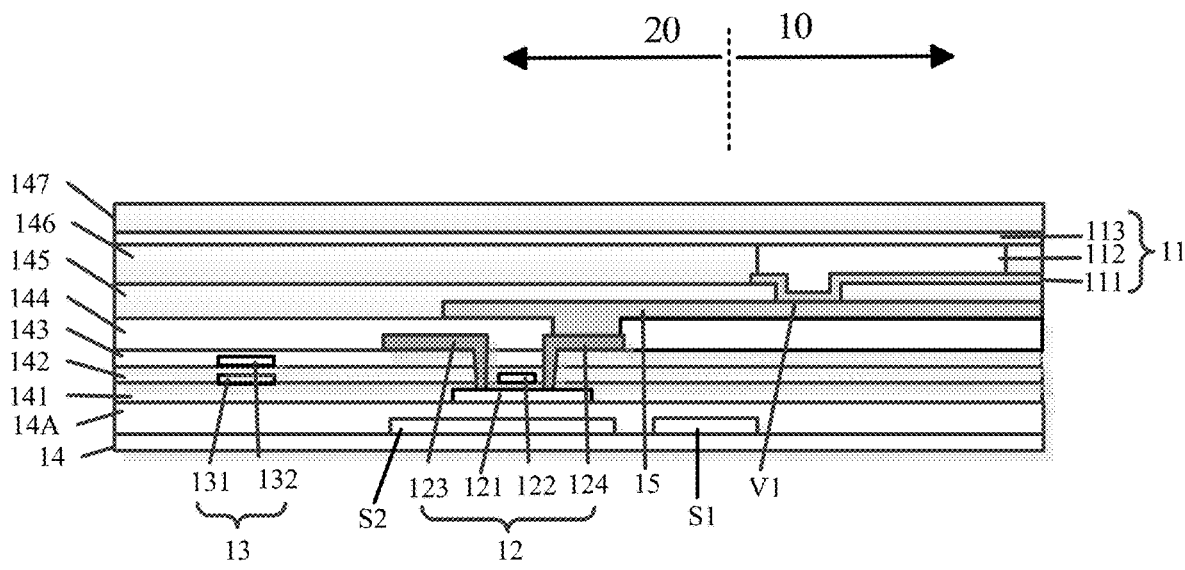
FIG. 9 is a schematic cross-sectional view of the display substrate in FIG. 3 along a line B-B.

For example, FIG. 9 is a schematic cross-sectional view of the display substrate in FIG. 3 along a line B-B. As shown in FIG. 9, the display substrate further comprises a base substrate 14 and a second light-shielding layer S2, the plurality of first sub-pixels are arranged on the base substrate 14, and the second light-shielding layer S2 is arranged between the plurality of first pixel circuits and the base substrate 14, so as to shield at least part of the circuit structures of the plurality of first pixel circuits, or shield at least part of the circuit structures of the plurality of second pixel circuits. For example, the second light-shielding layer S2 at least shields the active layer 121 of the first thin film transistor 12 to prevent light from the second side of the display substrate from entering the active layer 121 to affect the normal operation of the first thin film transistor 12. For example, the second light-shielding layer S2 is covered with an insulating layer 14A, so that the second light-shielding layer S2 is spaced apart from the plurality of first pixel circuits; for another example, the second light-shielding layer S2 at least shields the slits between different electrodes of the first pixel circuit or the second pixel circuit, or the slits between the electrodes and signal lines (for example, gate lines, data lines, and power lines). For example, the first light-shielding layer S1 and the second light-shielding layer S2 are provided in the same layer. For example, the first light-shielding layer S1 is disposed in the first sub-region 20A as in the above embodiment, so as to shield one or more slits between the plurality of signal lines L. Note that A shielding B here means that an orthographic projection of B on the plane where the display substrate is located is in an orthographic projection of A on the plane where the display substrate is located.

Figure 10:
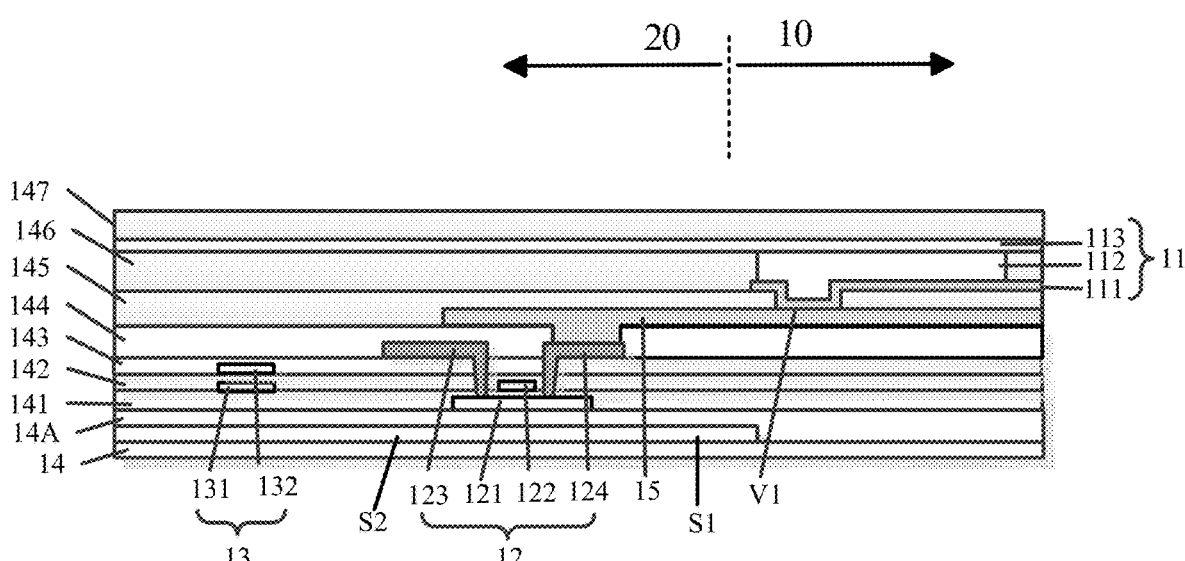
FIG. 10 is another schematic cross-sectional view of the display substrate in FIG. 3 along a line B-B.

For example, as shown in FIG. 9, the first light-shielding layer S1 and the second light-shielding layer S2 may be arranged at intervals, or, in some embodiments, as shown in FIG. 10, the first light-shielding layer S1 and the second light-shielding layer S2 are continuously arranged to form an integrated layer, and the integrated layer has an opening in the first display region 10, so that in the direction perpendicular to the surface of the display substrate, the first light-shielding layer S1 is not overlapped with the first display region 10.

Figure 11:
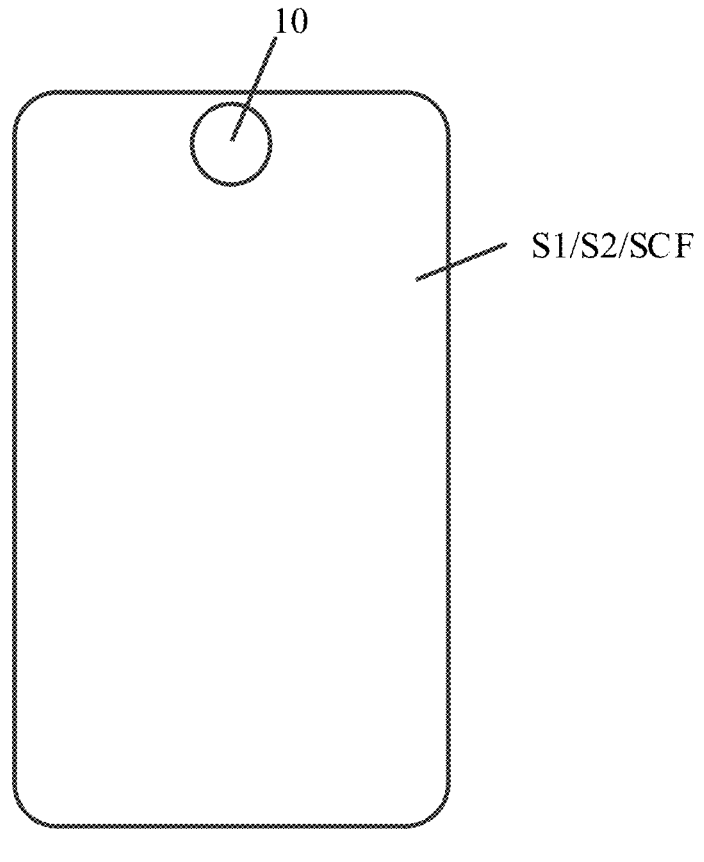
FIG. 11 is a schematic plan view of a first light-shielding layer in a display substrate provided by at least one embodiment of the present disclosure.

For example, as shown in FIG. 11, the integrated layer of the first light-shielding layer S1 and the second light-shielding layer S2 can completely cover the display region except the first display region 10 to fully achieve the light-shielding effect.

For example, in this example, the first light-shielding layer S1 and the second light-shielding layer S2 may be made of metal materials or alloy materials with good light-shielding properties, such as copper (Cu), aluminum (Al), titanium (Ti), or the like.

Figure 12:
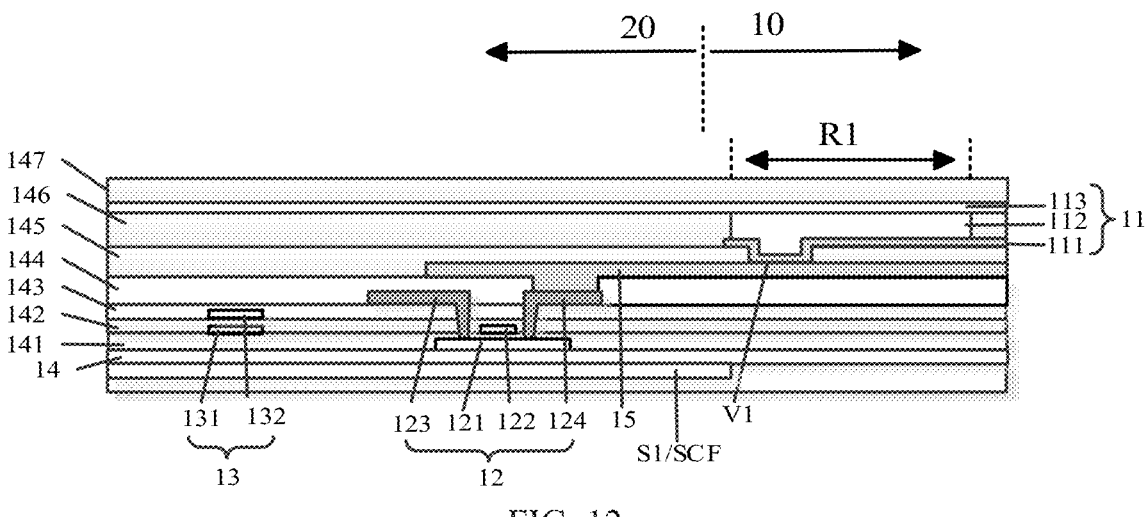
FIG. 12 is still another schematic cross-sectional view of the display substrate in FIG. 3 along a line B-B.

For example, in other embodiments, as shown in FIG. 12, the display substrate further comprises a base substrate 14 and a heat dissipation layer SCF, the plurality of first sub-pixels are arranged on a first side of the base substrate 14 (an upper side of the base substrate 14 shown in the figure), and the heat dissipation layer SCF is disposed on a second side of the base substrate 14 (a lower side of the base substrate 14 shown in the figure), the first side and the second side are opposite. For example, the first light-shielding layer S1 and the heat dissipation layer SCF are disposed in the same layer. For example, the first light-shielding layer S1 is disposed in the first sub-region 20A as in the above embodiment, so as to shield one or more slits between the plurality of signal lines L.

For example, the first light-shielding layer S1 and the heat dissipation layer SCF may be arranged at intervals, or, referring to FIG. 11 and FIG. 12, the first light-shielding layer S1 and the heat dissipation layer SCF may be continuously arranged to form an integrated layer, and the integrated layer has an opening in the first display region 10, so that in the direction perpendicular to the surface of the display substrate, the first light-shielding layer S1 is not overlapped with the first display region 10.

For example, in this example, the first light-shielding layer S1 and the heat dissipation layer SCF may be a metal layer, such as a copper foil to have the good light-shielding effect and the good heat dissipation effect at the same time. For example, in the manufacturing process of the display substrate, a copper foil with a certain shape and size (such as the shape and size shown in FIG. 11) can be formed by cutting, and then attached to the second side of the base substrate 14 to achieve the good light-shielding effect and the good heat dissipation effect at the same time.

In the embodiments of the present disclosure, as shown in FIG. 11, the first light-shielding layer S1 and the second light-shielding layer S2 are continuously arranged as an integrated layer or the first light-shielding layer S1 and the heat dissipation layer SCF are continuously arranged as an integrated layer, which can achieve the technical effect of completely shielding the second display region 20, thereby achieving a more sufficient light-shielding effect, improving the working quality of the under-screen sensor, for example, improving the photographing effect of the under-screen camera.

For example, in some embodiments, different first light-shielding layers S1 may be used at the same time, for example, any two or more of the first light-shielding layers S1 shown in FIG. 6, FIG. 9, FIG. 10, and FIG. 12 may be used at the same time to further improve the light-shielding effect. For example, in some embodiments, the first light-shielding layer S1 shown in FIG. 10 and the first light-shielding layer S1 shown in FIG. 11 may be used at the same time, or the first light-shielding layer S1 shown in FIG. 6 and the first light-shielding layer S1 shown in FIG. 11 may be used at the same time, or the first light-shielding layer S1 shown in FIG. 6 and the first light-shielding layer S1 shown in FIG. 10 may be used at the same time, or the first light-shielding layer S1 shown in FIG. 9 and the first light-shielding layer S1 shown in FIG. 11 may be used at the same time, and the like, that is, the display substrate has two or more first light-shielding layers S1 at the same time, so as to further improve the light-shielding effect.

For example, in some embodiments, as shown in FIGS. 6, 9, 10, and 12, the first pixel circuit comprises a first thin film transistor 12, and the first thin film transistor 12 comprises a first active layer 121, a first gate electrode 122, and first source-drain electrodes 123 and 124, the first light-emitting device 11 comprises a first electrode 111, a second electrode 113, and a first light-emitting layer 112 between the first electrode 111 and the second electrode 113, and the first electrode 111 of the first light-emitting device 11 is electrically connected to the first source-drain electrode 124 through a first via V1. For example, the first electrode 111 of the first light-emitting device 11 is first electrically connected to a transparent connection electrode 15 through the first via V1, and then electrically connected to the first source-drain electrode 124 through the transparent connection electrode 15.

For example, the transparent connection electrode 15 may be made of a transparent conductive material, such as a transparent metal oxide, such as indium tin oxide (ITO), etc., to have good light transparency. Generally, the transparent connection electrode 15 has better light transparency than the first electrode 111. Therefore, the transparent connection electrode 15 is used to electrically connect the first electrode 111 and the first source-drain electrode 124, which can further increase the light transparency of the first display region 10.

Figure 13:
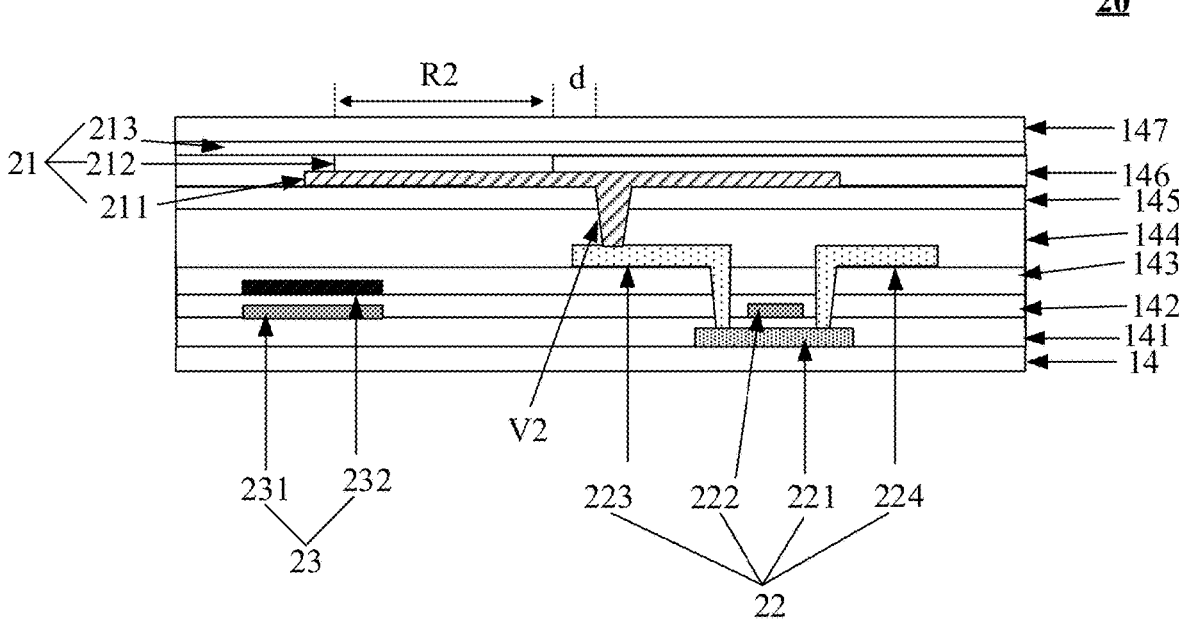
FIG. 13 is a schematic cross-sectional view of a second display region in a display substrate provided by at least one embodiment of the present disclosure.

As shown in FIG. 13, the second pixel circuit comprises a second thin film transistor 22, the second thin film transistor 22 comprises a second active layer 221, a second gate electrode 222, and second source-drain electrodes 223 and 224, the second light-emitting device 21 comprises a first electrode 211, a second electrode 213, and a second light-emitting layer 212 between the first electrode 211 and the second electrode 213. The first electrode 211 of the second light-emitting device 21 is electrically connected to the second source-drain electrode 223 through a second via V2.

For example, in the embodiments of the present disclosure, the display substrate further comprises structures such as a first gate insulating layer 141, a second gate insulating layer 142, an interlayer insulating layer 143, a first planarization layer 144, a second planarization layer 145, and a pixel defining layer 146, an encapsulation layer 147, etc., the embodiments of the present disclosure do not specifically limit other structures of the display substrate.

For example, the above-mentioned active layers may be made of amorphous silicon, polysilicon, or metal oxide semiconductor materials. For example, the polysilicon may be high temperature polysilicon or low temperature polysilicon, and the oxide semiconductor may be indium gallium zinc oxide (IGZO), indium zinc oxide (IZO), zinc oxide (ZnO), gallium zinc oxide (GZO), or the like. Each gate electrode may be made of copper (Cu), aluminum (Al), titanium (Ti), or other metal materials or alloy materials, for example, may be formed into a single-layer metal layer structure or a multi-layer metal layer structure, such as a multi-layer metal layer structure of titanium/aluminum/titanium. Each source-drain electrode may be made of copper (Cu), aluminum (Al), titanium (Ti), or other metal materials or alloy materials, for example, may be formed into a single-layer metal layer structure or a multi-layer metal layer structure, such as a multi-layer metal layer structure of titanium/aluminum/titanium, etc.

For example, the material of the first electrode of each light-emitting device may be transparent metal oxide such as indium tin oxide (ITO), indium zinc oxide (IZO), gallium zinc oxide (GZO), or the like, and the material of the second electrode may be lithium (Li), aluminum (Al), magnesium (Mg), silver (Ag), or other metal materials.

The base substrate 14 may be a rigid base substrate such as glass, quartz, or a flexible base substrate such as polyimide. The first gate insulating layer 141, the second gate insulating layer 142, and the interlayer insulating layer 143 may be made of inorganic insulating materials such as silicon oxide, silicon nitride, silicon oxynitride, or the like. The first planarization layer 144, the second planarization layer 145, and the pixel defining layer 146 may be made of organic insulating materials such as polyimide, resin, or the like.

The encapsulation layer 147 may include a stack layer of a plurality of organic encapsulation layers and inorganic encapsulation layers. The embodiments of the present disclosure do not specifically limit the material and structure of each functional layer of the display substrate.

For example, each light-emitting layer may be an organic light-emitting layer or a quantum dot light-emitting layer, etc., thus, the display substrate may be implemented as an organic light-emitting diode (OLED) display substrate or a quantum dot light-emitting diode (QLED) display substrate, etc., and the embodiments of the present disclosure do not specifically limit the type of the display substrate.

For example, in the plane where the display substrate is located, that is, in the plane parallel to the base substrate 14, a shortest distance between the first via V1 and a light-emitting region of the first light-emitting layer 112 (that is, the region where the first light-emitting layer 112 is directly opposite to and sandwiched between the first electrode 111 and the second electrode 113) is smaller than a shortest distance between the second via V2 and a light-emitting region of the second light-emitting layer 212 (that is, the region where the second light-emitting layer 212 is directly opposite to and sandwiched between the first electrode 211 and the second electrode 213). As a result, the distance between the first electrode 111 in the first display region 10 and the via V1 that the first electrode 111 passes through is reduced, so as to minimize the space occupied by the first electrode 111 as possible and increase the light transparency of the first display region 10.

Figure 14:
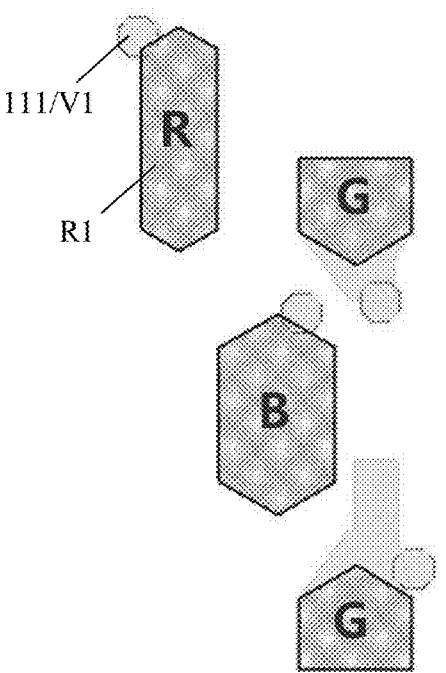
FIG. 14 is a schematic diagram of an arrangement of sub-pixels in a first display region of a display substrate provided by at least one embodiment of the present disclosure.
Figure 15:
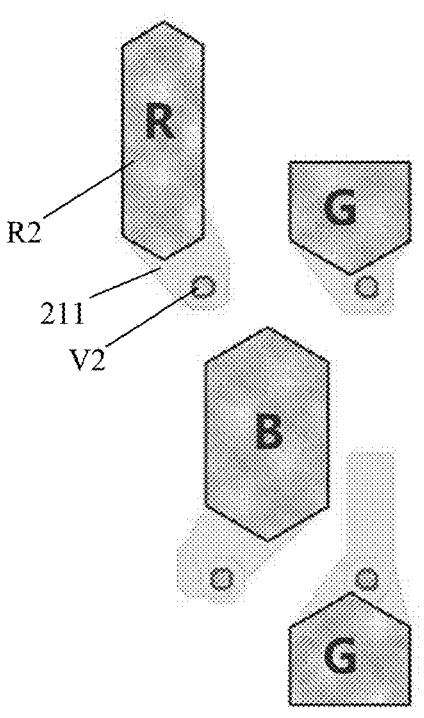
FIG. 15 is a schematic diagram of an arrangement of sub-pixels in a second display region of a display substrate provided by at least one embodiment of the present disclosure.

For example, FIG. 14 shows a schematic plan view of light-emitting regions of light-emitting devices of four sub-pixels and first electrode vias in the first display region 10, and the four sub-pixels constitute one pixel unit in the first display region 10. For example, the four sub-pixels comprise one red sub-pixel R, one blue sub-pixel B, and two green sub-pixels G. For example, FIG. 15 shows a schematic plan view of light-emitting regions of light-emitting devices of four sub-pixels and first electrode vias in the second display region 20, and the four sub-pixels constitute one pixel unit in the second display region 20. For example, the four sub-pixels comprise one red sub-pixel R, one blue sub-pixel B, and two green sub-pixels G.

For example, taking the red sub-pixel R as an example, in conjunction with FIGS. 12-15, the shortest distance between the first via V1 and the light-emitting region R1 of the first light-emitting layer 112 is smaller than the shortest distance d between the second via V2 and the light-emitting region R2 of the second light-emitting layer 212.

For example, in some embodiments, as shown in FIG. 12 and FIG. 14, an orthographic projection of the first via V1 on the plane where the display substrate is located is at least partially overlapped with an orthographic projection of the light-emitting region R1 of the first light-emitting layer 112 on the plane where the display substrate is located, in this case, the shortest distance between the first via V1 and the light-emitting region R1 of the first light-emitting layer 112 is zero. As shown in FIG. 13 and FIG. 15, an orthographic projection of the second via V2 on the plane where the display substrate is located is not overlapped with an orthographic projection of the light-emitting region R2 of the second light-emitting layer 212 on the plane where the display substrate is located, and the shortest distance between the second via V2 and the light-emitting region R2 of the first light-emitting layer 112 is d, and d is greater than zero.

Therefore, in the first display region 10, the distance between the first via V1 and the light-emitting region R1 of the first light-emitting layer 112 is closer, which can prevent the extension length of the first electrode 111 from being too long to affect the light transparency of the first display region 10.

For example, in some embodiments, as shown in FIG. 3 and FIG. 4A, the display region further comprises a third display region 30 at least partially surrounding the second display region 20, and the third display region 30 comprises a plurality of third sub-pixels P3 arranged in an array. For example, an arrangement density of the plurality of third sub-pixels P3 in the third display region 30 is greater than an arrangement density of the plurality of first sub-pixels P1 in the first display region 10, and is also greater than an arrangement density of the plurality of second sub-pixels P2 in the second display region 20, and therefore the third display region 30 has a higher resolution than the first display region 10 and the second display region 20. Moreover, the area occupied by the third display region 30 is larger than the area occupied by the first display region 10 and the second display region 20, and the third display region 30 is implemented as the main display region of the display substrate.

For example, in some examples, the arrangement density of the plurality of first sub-pixels P1 in the first display region 10 is equal to the arrangement density of the plurality of second sub-pixels P2 in the second display region 20. For example, in an example, the arrangement density of the plurality of third sub-pixels P3 in the third display region 30 is twice the arrangement density of the plurality of first sub-pixels P1 in the first display region 10.

For example, each third sub-pixel P3 in the third display region 30 comprises a third pixel circuit and a third light-emitting device. The specific structures of the third pixel circuit and the third light-emitting device are similar to those of the second pixel circuit and the second light-emitting device. For details, please refer to FIG. 13, which will not be repeated here.

Figure 16:
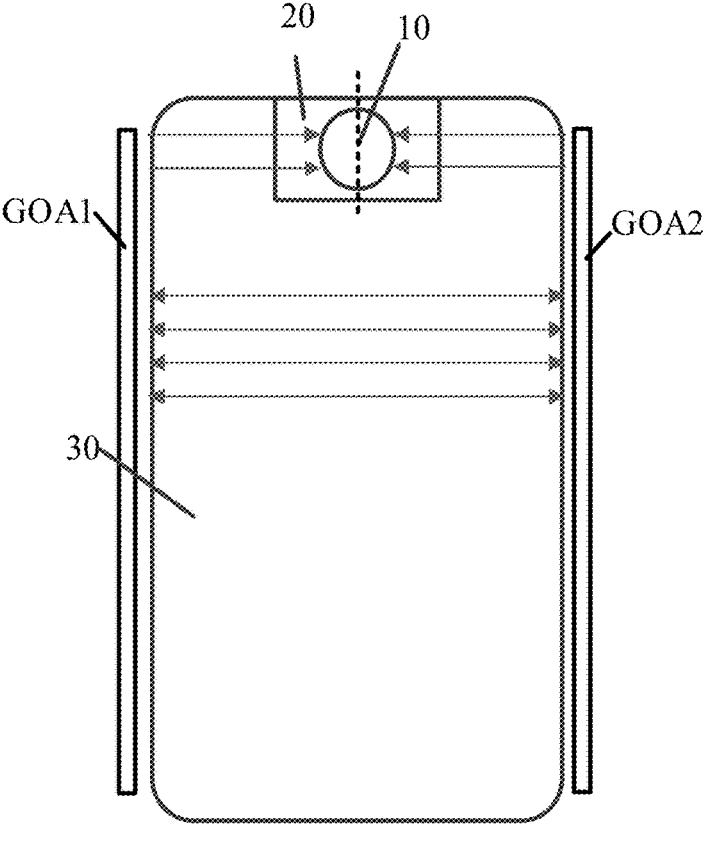
FIG. 16 is a schematic plan view of a display substrate provided by at least one embodiment of the present disclosure.

For example, in some embodiments, as shown in FIG. 16, the display substrate further comprises a first scan driving circuit (Gate on Array) GOA1 and a second scan driving circuit GOA2 respectively located on two opposite sides of the display region, the first scan driving circuit GOA1 and the second scan driving circuit GOA2 are configured to jointly provide electrical signals for the plurality of third sub-pixels in the third display region 30, that is, in the third display region 30, the GOA driving circuit adopts a bilateral driving mode, and the scan driving circuit on the left side of the third display region 30 and the scan driving circuit on the right side of the third display region 30 are connected to each other.

For example, the first scan driving circuit GOA1 is further configured to provide electrical signals for a plurality of second sub-pixels and a plurality of first pixel circuits in the second display region 20 on a side of the first display region 10 close to the first scan driving circuit GOA1, for example, provides electrical signals for the plurality of second sub-pixels and the plurality of first pixel circuits in the second display region 20 on the left side of the dotted line in FIG. 8; and the second scan driving circuit GOA2 is further configured to provide electrical signals for a plurality of second sub-pixels and a plurality of first pixel circuits in the second display region 20 on the side of the first display region 10 close to the second scan driving circuit GOA2, for example, provides the electrical signals for the plurality of second sub-pixels and the plurality of first pixel circuits in the second display region 20 on the right side of the dotted line in FIG. 8. That is, for the first display region 10 and the second display region 20, the GOA driving circuit adopts a unilateral driving mode, and the scan driving circuits on both sides of the first display region 10 and the second display region 20 for providing electrical signals to the first display region 10 and the second display region 20 are not connected to each other.

For example, as described above, the display substrate further comprises a power line and a reset voltage line, and the first light-shielding layer S1 is electrically connected to the power line or the reset voltage line to prevent the first light-shielding layer S1 from being in a floating state. Hereinafter, the connection relationship between the driving circuit of the display substrate and the power line as well as the reset voltage line will be exemplarily introduced with reference to the accompanying drawings.

Figure 17:
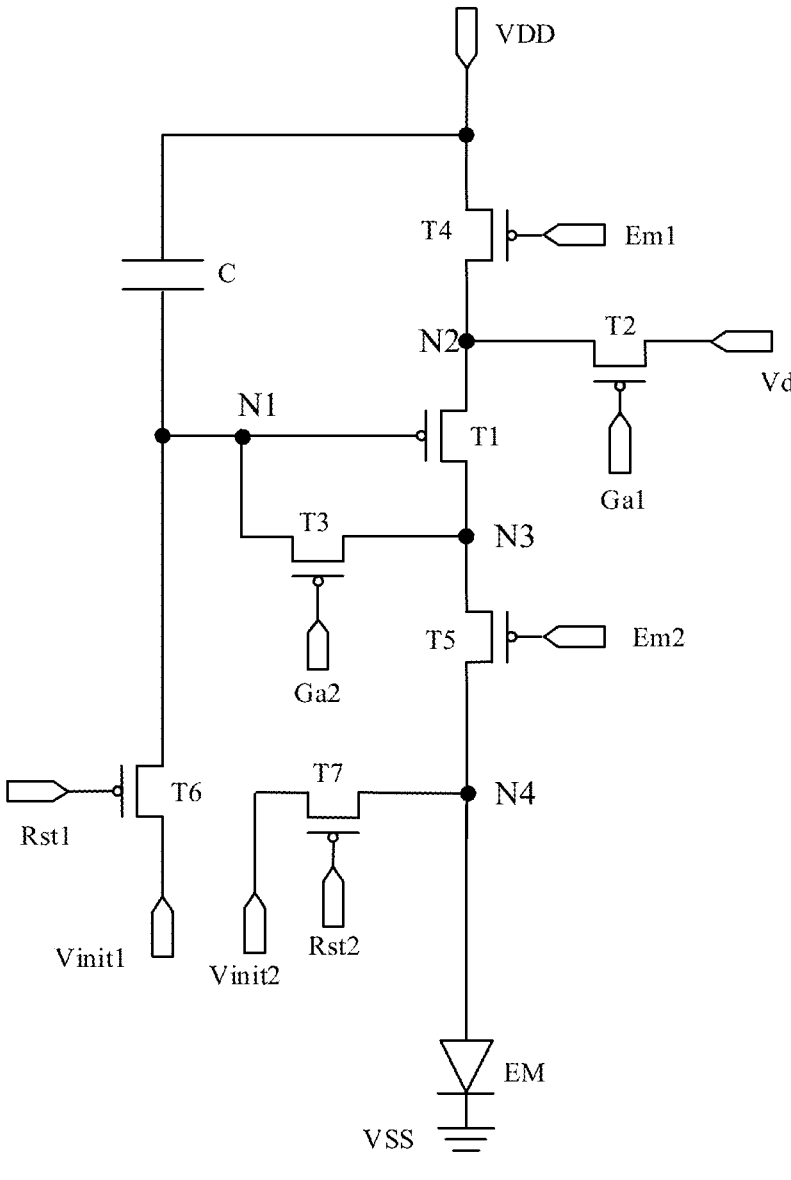
FIG. 17 is a pixel circuit diagram of a display substrate provided by at least one embodiment of the present disclosure.

For example, in some examples, the first pixel circuit, the second pixel circuit, and the third pixel circuit in the display substrate may be 2T1C, 7T1C, or other pixel driving circuits. For example, FIG. 17 shows a circuit diagram of a 7T1C pixel circuit. As shown in FIG. 17, the pixel circuit comprises a driving transistor T1, a data writing transistor T2, a compensation transistor T3, a storage capacitor C, a first light-emitting control transistor T4, a second light-emitting control transistor T5, a first reset transistor T6, and a second reset transistor T7.

For example, the driving transistor T1 comprises a control terminal, a first terminal, and a second terminal, and is configured to control a driving current flowing through the light-emitting device EM, the control terminal of the driving transistor T1 is connected to a first node N1, the first terminal of the driving transistor T1 is connected to a second node N2, and the second terminal of the driving transistor T1 is connected to a third node N3.

For example, the data writing transistor T2 comprises a control terminal, a first terminal, and a second terminal. The control terminal of the data writing transistor T2 is configured to receive a first scan signal Ga1, the first terminal of the data writing transistor T2 is configured to receive a data signal, and the second terminal of the data writing transistor T2 is connected to the first terminal (the second node N2) of the driving transistor T1, and the data writing transistor T2 is configured to write the data signal to the first terminal of the driving transistor T1 in response to the first scan signal Ga1. For example, the first terminal of the data writing transistor T2 is connected to a data line to receive the data signal, and the control terminal of the data writing transistor T2 is connected to a scan line to receive the first scan signal Ga1.

For example, in a data writing phase, the data writing transistor T2 can be turned on in response to the first scan signal Ga1, so that the data signal can be written to the first terminal (the second node N2) of the driving transistor T1, and the data signal can be stored in the storage capacitor C, so that a driving current for driving the light-emitting device EM to emit light can be generated according to the data signal during, for example, a light-emitting phase.

For example, the compensation transistor T3 comprises a control terminal, a first terminal, and a second terminal. The control terminal of the compensation transistor T3 is configured to receive a second scan signal Ga2, the first terminal and the second terminal of the compensation transistor T3 are electrically connected to the control terminal and the second terminal of the driving transistor T1, respectively, and the compensation circuit is configured to perform threshold compensation in response to the second scan signal.

For example, the storage capacitor C is electrically connected to the control terminal of the driving transistor T1 and a first voltage terminal VDD, and is configured to store the data signal written by the data writing transistor T2. For example, in a data writing and compensation phase, the compensation transistor T3 can be turned on in response to the second scan signal Ga2, so that the data signal written by the data writing transistor T2 can be stored in the storage capacitor C. For example, at the same time in the data writing and compensation phase, the compensation transistor T3 can electrically connect the control terminal and the second terminal of the driving transistor T1, and therefore information about the threshold voltage of the driving transistor T1 can be correspondingly stored in the storage circuit, so that, for example, in the light-emitting phase, the stored data signal and the threshold voltage can be used to control the driving transistor T1, so that the output of the driving transistor T1 is compensated.

For example, the first light-emitting control transistor T4 is connected to the first terminal (the second node N2) of the driving transistor T1 and the first voltage terminal VDD, and is configured to apply a first power voltage of the first voltage terminal VDD to the first terminal of the driving transistor T1 in response to a first light-emitting control signal. For example, the first light-emitting control transistor T4 is connected to a first light-emitting control terminal Em1, the first voltage terminal VDD, and the second node N2.

For example, the second light-emitting control transistor T5 is connected to a second light-emitting control terminal Em2, a first terminal of the light-emitting device EM, and the second terminal of the driving transistor T1, and is configured to respond to the second light-emitting control signal so that the driving current can be applied to the light-emitting device EM.

For example, in the light-emitting phase, the second light-emitting control transistor T5 is turned on in response to the second light-emitting control signal provided by the second light-emitting control terminal Em2, so that the driving transistor T1 can apply the driving current to the light-emitting device EM through the second light-emitting control transistor T5 to make the light-emitting device EM emit light; in a non-light-emitting phase, the second light-emitting control transistor T5 is turned off in response to the second light-emitting control signal, so as to avoid current flowing through the light-emitting device EM to cause the light-emitting device EM to emit light, thereby improving the contrast of the corresponding display device.

For another example, in an initialization phase, the second light-emitting control transistor T5 can also be turned on in response to the second light-emitting control signal, so that the second light-emitting control transistor T5 can be combined with the reset circuit to perform a reset operation on the driving transistor T1 and the light-emitting device EM.

For example, the second light-emitting control signal Em2 may be the same as or different from the first light-emitting control signal Em1, for example, the second light-emitting control signal Em2 and the first light-emitting control signal Em1 may be connected to the same or different signal output terminals.

For example, the first reset transistor T6 is configured to apply a first reset voltage Vini1 to the first node N1 in response to a first reset signal Rst1, and the second reset transistor T7 is configured to apply a second reset voltage Vini2 to a fourth node N4 in response to a second reset signal Rst2. For example, in the initialization phase, the first reset transistor T6 and the second reset transistor T7 can be turned on in response to the reset signal, so that the reset voltage can be applied to a first terminal of the light-emitting device EM and the first node N1, so that the driving transistor T1, the compensation transistor T3, and the light-emitting device EM can be reset to eliminate the influence of the previous light-emitting phase.

For example, the light-emitting device EM comprises a first terminal and a second terminal, the first terminal of the light-emitting device EM is configured to receive the driving current from the second terminal of the driving transistor T1, and the second terminal of the light-emitting device EM is configured to be connected to a second voltage terminal VSS. For example, the first terminal of the light-emitting device EM may be connected to the third node N3.

It should be noted that the first node N1, the second node N2, the third node N3, and the fourth node N4 do not necessarily represent actual components, but rather represent the junction nodes of related circuit connections in the circuit diagram. The symbol Vd may represent both the data signal terminal and the level of the data signal, similarly, Ga1 and Ga2 may represent the first scan signal and the second scan signal, and may also represent the first scan signal terminal and the second scan signal terminal, Rst may represent both the reset control terminal and the reset signal, the symbol Vinit may represent both the reset voltage terminal and the reset voltage, the symbol VDD may represent both the first voltage terminal and the first power voltage, and the symbol VSS may represent both the second voltage terminal and the second power voltage. The following embodiments are the same as those described herein, and similar portions will not be repeated again. For example, in some example, the second voltage terminal can be grounded, that is, VSS can be 0V.

For example, the first light-shielding layer S1 may be electrically connected to a power line that transmits the first power voltage VDD or the second power voltage VSS, or is electrically connected to a reset voltage line that transmits the reset voltage Vini1 or Vini2. For example, in a case where the first light-shielding layer S1 is provided in the same layer as the power line or the reset voltage line, the first light-shielding layer S1 may be directly electrically connected to the power line or the reset voltage line through a connection line, or, in a case where the first light-shielding layer S1 and the power line or the reset voltage line are arranged in different layers, the first light-shielding layer S1 may be electrically connected to the power line or the reset voltage line through a via.

For example, in a case where the first light-shielding layer S1 is overlapped with the power line or the reset voltage line in the direction perpendicular to the surface of the display substrate, a via may be directly formed between the first light-shielding layer S1 and the power line or the reset voltage line, so that the first light-shielding layer S1 is electrically connected to the power line or the reset voltage line through the via. Alternatively, in a case where the first light-shielding layer S1 is not overlapped with the power line or the reset voltage line in the direction perpendicular to the surface of the display substrate, the first light-shielding layer S1 may be extended to a position overlapped with the power line or the reset voltage line, and then a via is formed between the first light-shielding layer S1 at the position and the power line or the reset voltage line, thereby making an electrical connection; alternatively, the power line or the reset voltage line is extended to a position overlapped with the first light-shielding layer S1, and then a via is formed between the power line or the reset voltage line at the position and the first light-shielding layer S1, thereby making an electrical connection. For example, the power line or the reset voltage line may also be introduced to a position overlapped with the first light-shielding layer S1 by using a connection line, and then a via is formed between the connection line and the first light-shielding layer S1, and the connection line and the first light-shielding layer S1 are electrically connected. In the embodiments of the present disclosure, the first light-shielding layer S1 can be electrically connected to the power line or the reset voltage line through any suitable manner. The embodiments of the present disclosure do not specifically limit the manner in which the first light-shielding layer S1 is electrically connected to the power line or the reset voltage line. Therefore, a certain power voltage or reset voltage can be transmitted to the first light-shielding layer S1, which can prevent the first light-shielding layer S1 from being in a floating state and from affecting the signal transmission on the display substrate.

In summary, in the display substrate provided by at least one embodiment of the present disclosure, the first light-shielding layer can effectively block at least part of the light entering the second display region, so as to prevent the light from entering the under-screen sensor, such as a camera, through the second display region, thereby improving the sensing effect, for example, improving the shooting quality of the under-screen camera. In addition, the first light-shielding layer can be input with a certain electrical signal, so as not to affect the normal operation of the driving circuit in the display substrate. Moreover, the first light-shielding layer can be arranged in the same layer as some existing functional layers in the display substrate, so that the first light-shielding layer and the existing functional layers can be formed using the same material through the same process in the manufacturing process, which can also simplify the manufacturing process of the display substrate, that is, without increasing the manufacturing difficulty of the display substrate, the working quality of the under-screen sensor of the display substrate, such as a camera, is improved, and the narrow frame design of the display substrate is also achieved.

Figure 18A:
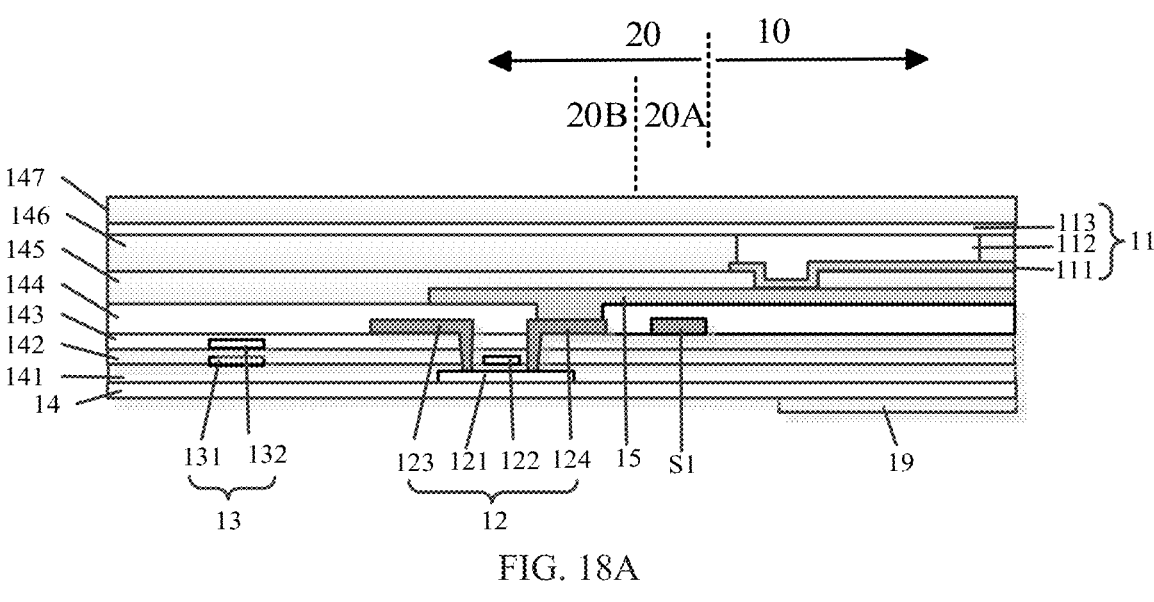
FIG. 18A is a schematic cross-sectional view of a display device provided by at least one embodiment of the present disclosure.

At least one embodiment of the present disclosure further provides a display device. As shown in FIG. 18A, the display device comprises any one of the above-mentioned display substrates (the display substrate in FIG. 6 is shown as an example in FIG. 18A) and a sensor 19. The sensor 19 is provided on the second side (non-display side) of the display substrate, and the sensor is configured to receive light from the first side (display side). For example, the sensor 19 may be any type of sensor such as a camera, an infrared sensor, or the like.

Figure 18B:
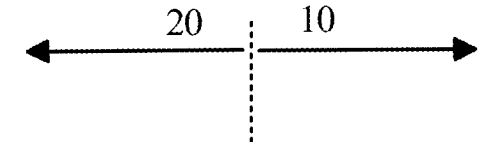
FIG. 18B is a schematic cross-sectional view of another display device provided by at least one embodiment of the present disclosure.
Figure 18B:
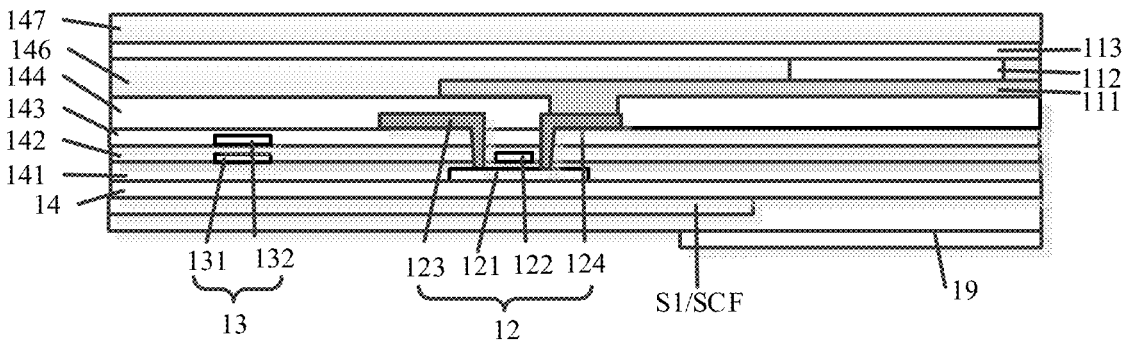

For example, FIG. 18B shows a schematic cross-sectional view of another display device provided by at least one embodiment of the present disclosure. As shown in FIG. 18B, the first light-shielding layer S1 and the heat dissipation layer SCF in the display device are arranged in the same layer, for example, the arrangement mode of the first light-shielding layer S1 in the display substrate shown in FIG. 12 is adopted. Unlike the display substrate shown in FIG. 12, in FIG. 18B, the first electrode 111 of the first light-emitting device is directly electrically connected to the first source-drain electrode 124 through the via exposing the first source-drain 124, thereby saving the transparent connection electrode 15 and the second planarization layer 145 and simplifying the film structure of the display substrate.

For example, in some embodiments, in the direction perpendicular to the surface of the display substrate, the sensor 19 is at least partially overlapped with the first display region 10 of the display substrate so as to fully receive the light from the first side, and operates based on the light. Because the display substrate has a first light-shielding layer that shields the second display region, the sensor 19 only receives the light transmitted through the first display region, which can prevent the light from passing through the second display region to reach to the sensor 19 and from affecting the operation of the sensor 19, and therefore the sensor 19 of the display device has a relatively high working quality. For example, when the sensor 19 is a camera, the camera has a relatively high photographing quality.

For example, the display device provided by at least one embodiment of the present disclosure may be any product or component with a display function, such as a display substrate, a display panel, an electronic paper, a mobile phone, a tablet computer, a television, a monitor, a notebook computer, a digital photo frame, a navigator, etc. The embodiments of the present disclosure do not limit this.

Figure 19A:
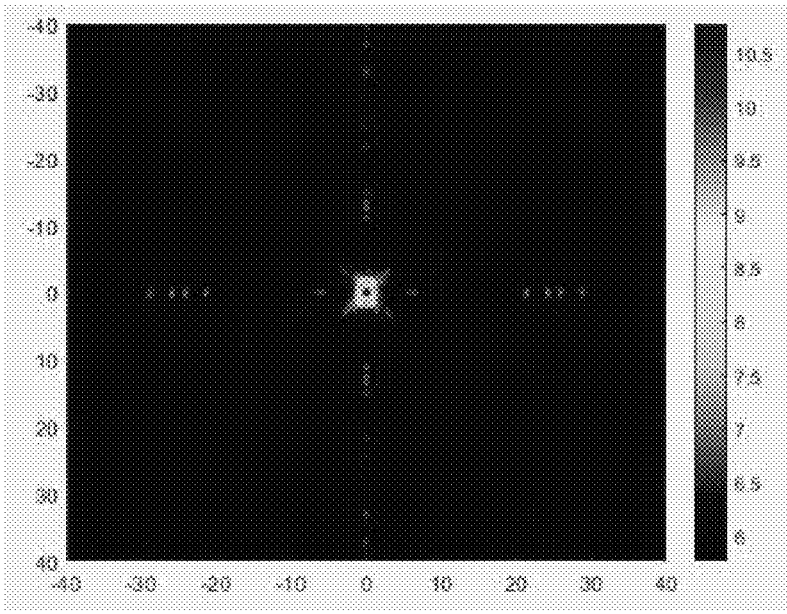
FIGS. 19A and 19B are point spread function simulation diagrams of point light source imaging in a case that the display device does not have a first light-shielding layer and in a case that the display device has the first light-shielding layer, respectively.
Figure 19B:
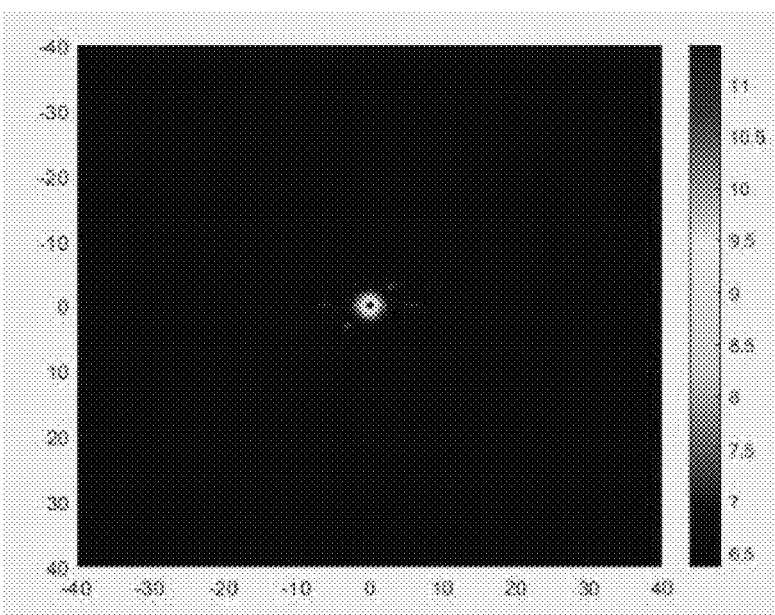

For example, FIG. 19A and FIG. 19B show point spread function simulation diagrams of point light source imaging in a case that the display device does not have a first light-shielding layer and in a case that the display device has the first light-shielding layer, respectively, this simulation diagram describes the energy distribution state of the under-screen camera on the imaging surface after imaging by a point light source, that is, the dispersion distribution of energy in various directions (embodied in XY coordinates) such as up, down, left, and right, which can intuitively characterize the glare phenomenon of the point light source. As shown in FIG. 19A, in a case that the first light-shielding layer is not provided in the second display region, under the oblique field angle, the light passes through the second display region, which is similar to passing through a grating with a small aperture ratio. In this case, the center energy peak of the point light source imaging is only 10.5, and the glare phenomenon of the point light source is serious. As shown in FIG. 19B, after the first light-shielding layer is provided in the second display region, under the oblique field angle, light can only pass through the first display region, and the center energy peak of the point light source imaging is greater than 11, and the glare phenomenon of the point light source is significantly ameliorated.

Figure 20A:
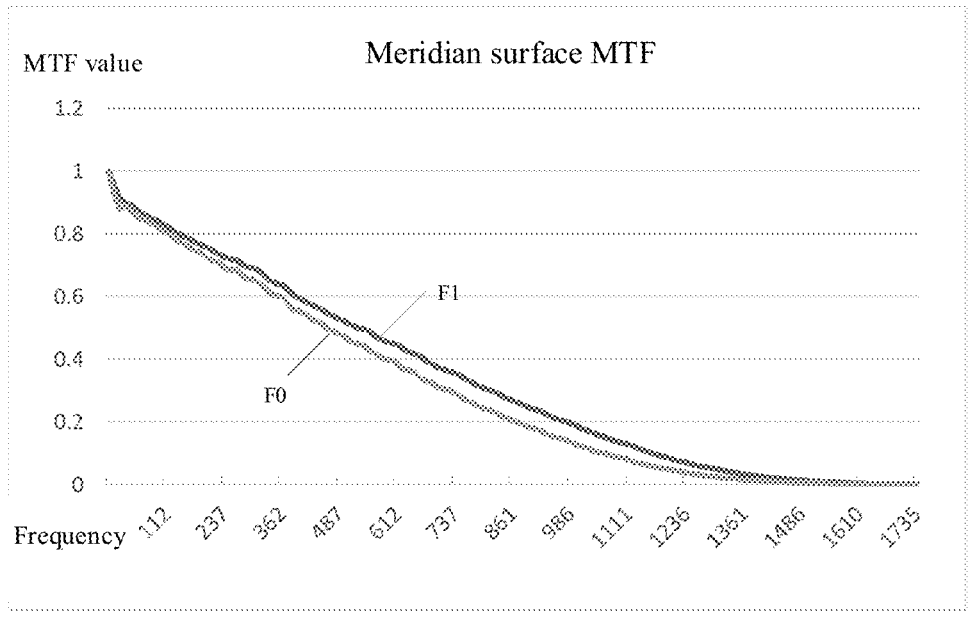
FIGS. 20A and 20B are two modulation transfer function diagrams of point light source imaging in a case that the display device does not have a first light-shielding layer and in a case that the display device has the first light-shielding layer, respectively.
Figure 20B:
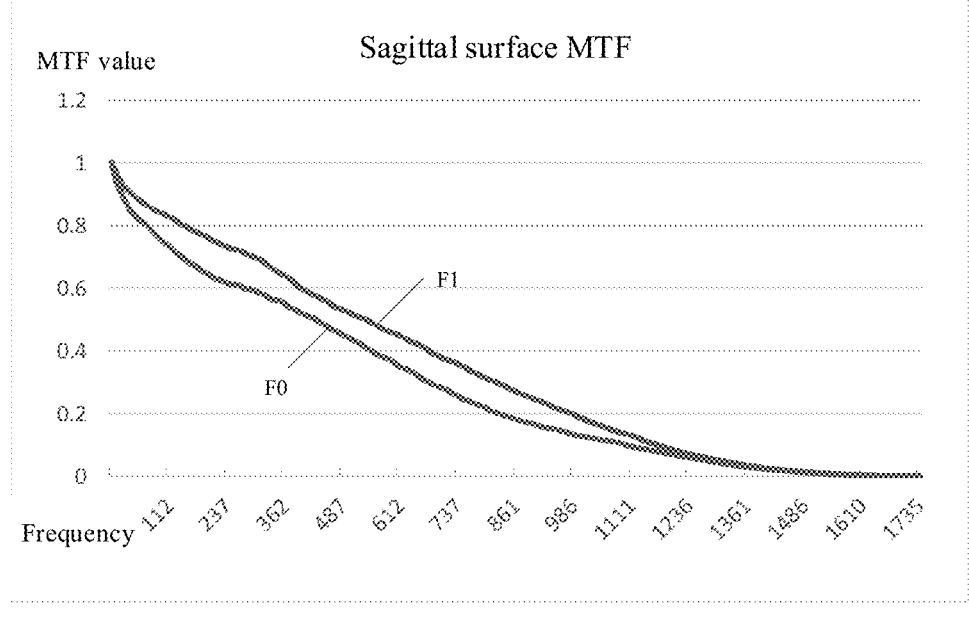

FIG. 20A and FIG. 20B show two modulation transfer function diagrams of point light source imaging on a meridian surface and a sagittal surface in a case that the display device does not have a first light-shielding layer and in a case that the display device has the first light-shielding layer, respectively; the abscissa in the figure represents spatial frequency (that is, the spatial line pair per millimeter, the unit is 1p/mm), the ordinate is the MTF value, which is used to characterize the resolution at different spatial frequencies. At the same spatial frequency, the higher the MTF value, the higher the imaging resolution. In FIG. 20A and FIG. 20B, the F0 curve is the modulation transfer function curve of the point light source imaging in a case that the display device does not have the first light-shielding layer, and the F1 curve is the modulation transfer function curve of the point light source imaging after the display device is provided with the first light-shielding layer, it can be seen that under the same spatial frequency, the MTF value of the F1 curve is higher than the MTF value of the F0 curve, that is, after the first light-shielding layer is provided, the imaging resolution of the point light source of the display device is significantly improved.

Figure 21A:
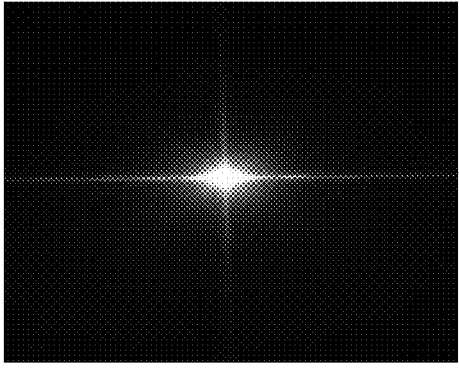
FIGS. 21A and 21B are real glare photos of point light source imaging in a case that the display device does not have a first light-shielding layer and in a case that the display device has the first light-shielding layer, respectively.
Figure 21B:
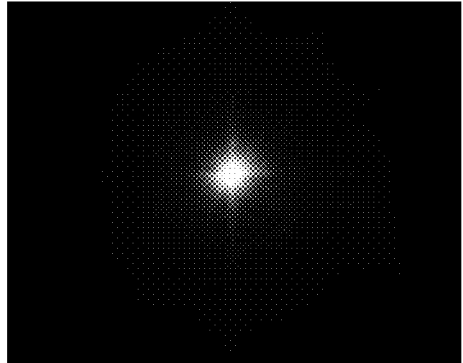

For example, FIG. 21A shows a real glare photo of point light source imaging in a case that the display device does not have a first light-shielding layer; and FIG. 21B shows a real glare photo of point light source imaging after the display device is provided with the first light-shielding layer, by comparing FIG. 21A and FIG. 21B, it can be seen that after the first light-shielding layer is provided, the glare phenomenon of the point light source imaging of the display device is significantly ameliorated.

The following several statements should be noted:

(1) The accompanying drawings involve only the structure(s) in connection with the embodiment(s) of the present disclosure, and other structure(s) can be referred to common design(s).

(2) For clarity, in accompanying drawings for illustrating the embodiment(s) of the present disclosure, the thickness of a layer or a region may be enlarged or reduced. However, it should be understood that, in the case in which a component or element such as a layer, film, region, substrate or the like is referred to be "on" or "under" another component or element, it may be directly on or under the another component or element or a component or element is interposed therebetween.

(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A display substrate, having a first side for display and a second side opposite to the first side, wherein the display substrate comprises a display region;

the display region comprises a first display region and a second display region at least partially surrounding the first display region, the first display region allows light from the first side to be at least partially transmitted to the second side;

the first display region comprises a plurality of first sub-pixels arranged in an array, each of the plurality of first sub-pixels comprises a first light-emitting device, the second display region comprises a plurality of first pixel circuits, and the plurality of first pixel circuits are respectively electrically connected to a plurality of first light-emitting devices of the plurality of first sub-pixels to drive the plurality of first light-emitting devices, respectively;

the display region further comprises a first light-shielding layer, in a direction perpendicular to a surface of the display substrate, the first light-shielding layer is at least partially overlapped with the second display region, and the first light-shielding layer is not overlapped with the first display region;

the display substrate further comprises a plurality of signal lines respectively electrically connected to the plurality of first pixel circuits, in the direction perpendicular to the surface of the display substrate, the first light-shielding layer at least partially overlaps with the plurality of signal lines to shield one or more slits between the plurality of signal lines;

the second display region comprises a first sub-region at least partially surrounding the first display region and a second sub-region at least partially surrounding the first sub-region, the first light-shielding layer is in the first sub-region, and the plurality of first pixel circuits are in the second sub-region;

all the plurality of first pixel circuits are on a side of the first light-shielding layer away from the first display region, in the direction perpendicular to a surface of the display substrate, no first pixel circuit is overlapped with the first light-shielding layer;

each of the plurality of first pixel circuits comprises a driving transistor, a first light-emitting control transistor, a first reset transistor, and a second reset transistor, the driving transistor comprises a control terminal, a first terminal, and a second terminal, the control terminal of the driving transistor is connected to a first node, the first terminal of the driving transistor is connected to a second node, and the second terminal of the driving transistor is connected to a third node, the first light-emitting control transistor comprises a first terminal and a second terminal, the first terminal and the second terminal are respectively connected to the first terminal of the driving transistor and a first voltage terminal;

the first reset transistor is configured to apply a first reset voltage to the first node in response to a first reset signal, and the second reset transistor is configured to apply a second reset voltage to a fourth node in response to a second reset signal, the first light-emitting device comprises a first terminal and a second terminal, the first terminal of the light-emitting device is connected to the fourth node, and the second terminal of the light-emitting device is connected to a second voltage terminal;

the first light-shielding layer is electrically connected to a power line connected to the first voltage terminal or the second voltage terminal, or electrically connected to a reset voltage line for transmitting the first reset voltage or the second reset voltage.

2. The display substrate according to claim 1, wherein each of the plurality of first pixel circuits comprises a first thin film transistor, the first thin film transistor comprises a first active layer, a first gate electrode, and a first source-drain electrode;

the first light-shielding layer and the first source-drain electrode are arranged in a same layer.

3. The display substrate according to claim 1, further comprising a base substrate and a second light-shielding layer, wherein the plurality of first sub-pixels are on the base substrate, and the second light-shielding layer is between the plurality of first pixel circuits and the base substrate to shield at least part of circuit structures of the plurality of first pixel circuits;

the first light-shielding layer and the second light-shielding layer are arranged in a same layer.

4. The display substrate according to claim 3, wherein the first light-shielding layer and the second light-shielding layer are continuously arranged to form an integrated layer, and the integrated layer has an opening in the first display region, so that in the direction perpendicular to the surface of the display substrate, the first light-shielding layer is not overlapped with the first display region.

5. The display substrate according to claim 1, further comprising a base substrate and a heat dissipation layer, wherein the plurality of first sub-pixels are on a first side of the base substrate, and the heat dissipation layer is on a second side of the base substrate, the first side and the second side are opposite;

the first light-shielding layer and the heat dissipation layer are arranged in a same layer.

6. The display substrate according to claim 5, wherein the first light-shielding layer and the heat dissipation layer are continuously arranged to form an integrated layer, and the integrated layer has an opening in the first display region, so that in the direction perpendicular to the surface of the display substrate, the first light-shielding layer is not overlapped with the first display region.

7. The display substrate according to claim 1, wherein the second display region further comprises a plurality of second sub-pixels, and each of the plurality of second sub-pixels comprises a second light-emitting device and a second pixel circuit electrically connected to the second light-emitting device, and the second pixel circuit is configured to drive the second light-emitting device, in the second display region, the plurality of second pixel circuits are arranged in a first array, the plurality of first pixel circuits are arranged in gaps of the first array, and the plurality of first pixel circuits and the plurality of second pixel circuits are arranged in a second array as a whole.

8. The display substrate according to claim 7, wherein each of the plurality of first pixel circuits comprises a first thin film transistor, the first thin film transistor comprises a first active layer, a first gate electrode, and a first source-drain electrode, the first light-emitting device comprises a first electrode, a second electrode, and a first light-emitting layer between the first electrode and the second electrode of the first light-emitting device, the first electrode of the first light-emitting device is electrically connected to the first source-drain electrode through a first via;

each of the plurality of second pixel circuits comprises a second thin film transistor, and the second thin film transistor comprises a second active layer, a second gate electrode, and a second source-drain electrode, the second light-emitting device comprises a first electrode, a second electrode, and a second light-emitting layer between the first electrode and the second electrode of the second light-emitting device, the first electrode of the second light-emitting device is electrically connected to the second source-drain electrode through a second via;

in a plane where the display substrate is located, a shortest distance between the first via and a light-emitting region of the first light-emitting layer is smaller than a shortest distance between the second via and a light-emitting region of the second light-emitting layer.

9. The display substrate according to claim 8, wherein an orthographic projection of the first via on the plane where the display substrate is located is at least partially over-lapped with an orthographic projection of the light-emitting region of the first light-emitting layer on the plane where the display substrate is located.

10. The display substrate according to claim 1, wherein the display region comprises a third display region at least partially surrounding the second display region, and the third display region comprises a plurality of third sub-pixels arranged in an array, an arrangement density of the plurality of third sub-pixels in the third display region is greater than an arrange-ment density of the plurality of first sub-pixels in the first display region, and is also greater than an arrange-ment density of the plurality of second sub-pixels in the second display region.

11. The display substrate according to claim 10, wherein the arrangement density of the plurality of first sub-pixels in the first display region is equal to the arrangement density of the plurality of second sub-pixels in the second display region.

12. The display substrate according to claim 11, wherein the plurality of signal lines extend through the first sub-region, each of the plurality of first pixel circuits further com-prises a first storage capacitor, and the first storage capacitor comprises a first capacitor electrode and a second capacitor electrode, the first capacitor electrode and the first gate electrode are arranged in a same layer, and the plurality of signal lines are arranged in a same layer as the first capacitor electrode or the second capacitor electrode.

13. The display substrate according to claim 10, further comprising a first scan driving circuit and a second scan driving circuit respectively located on two opposite sides of the display region, wherein the first scan driving circuit and the second scan driving circuit are configured to provide electrical signals for the plurality of third sub-pixels in the third display region;

the first scan driving circuit is further configured to provide electrical signals for a plurality of second sub-pixels and a plurality of first pixel circuits in the second display region on a side of the first display region close to the first scan driving circuit, and the second scan driving circuit is further configured to provide electrical signals for a plurality of second sub-pixels and a plurality of first pixel circuits in the second display region on a side of the first display region close to the second scan driving circuit.

14. A display device, comprising:

the display substrate according to claim 1, and a sensor, wherein the sensor is on the second side of the display substrate, and the sensor is configured to receive light from the first side.

15. The display device according to claim 14, wherein in the direction perpendicular to the surface of the display substrate, the sensor is at least partially overlapped with the first display region of the display substrate.

16. The display substrate according to claim 1, wherein each of the plurality of first pixel circuits comprises a first thin film transistor, the first thin film transistor comprises a first active layer, a first gate electrode, and a first source-drain electrode;

the first light-shielding layer and the first source-drain electrode are arranged in a same layer.

17. The display substrate according to claim 1, further comprising a base substrate and a second light-shielding layer, wherein the plurality of first sub-pixels are on the base substrate, and the second light-shielding layer is between the plurality of first pixel circuits and the base substrate to shield at least part of circuit structures of the plurality of first pixel circuits;

the first light-shielding layer and the second light-shield-ing layer are arranged in a same layer.

18. The display substrate according to claim 1, further comprising a base substrate and a heat dissipation layer, wherein the plurality of first sub-pixels are on a first side of the base substrate, and the heat dissipation layer is on a second side of the base substrate, the first side and the second side are opposite;

the first light-shielding layer and the heat dissipation layer are arranged in a same layer.

* * * * *